(12) United States Patent
Seki et al.

(10) Patent No.: US 11,984,638 B2
(45) Date of Patent: May 14, 2024

(54) DIRECTIONAL COUPLER

(71) Applicant: Murata Manufacturing Co., Ltd., Kyoto (JP)

(72) Inventors: Kenta Seki, Kyoto (JP); Ryangsu Kim, Kyoto (JP); Kazuhito Osawa, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 361 days.

(21) Appl. No.: 17/461,099

(22) Filed: Aug. 30, 2021

(65) Prior Publication Data
US 2022/0077560 A1 Mar. 10, 2022

(30) Foreign Application Priority Data
Sep. 4, 2020 (JP) .................................. 2020-148700

(51) Int. Cl.
H01P 5/18 (2006.01)
H03H 7/01 (2006.01)
H03H 1/00 (2006.01)

(52) U.S. Cl.
CPC .............. *H01P 5/187* (2013.01); *H01P 5/188* (2013.01); *H03H 2001/0085* (2013.01)

(58) Field of Classification Search
CPC . H01P 5/18; H01P 5/185; H01P 5/187; H03H 2001/0085; H03H 7/0115

USPC .......................... 333/109, 112, 116, 175, 185
See application file for complete search history.

(56) References Cited

U.S. PATENT DOCUMENTS

2019/0006729 A1* 1/2019 Tamaru .................... H03H 1/00

FOREIGN PATENT DOCUMENTS

| JP | H08-116203 A | 5/1996 |
|---|---|---|
| JP | 2014-239550 A | 12/2014 |
| JP | 2015-177330 A | 10/2015 |

* cited by examiner

Primary Examiner — Rakesh B Patel
(74) Attorney, Agent, or Firm — Pearne & Gordon LLP

(57) ABSTRACT

A directional coupler includes a multilayer body, a conductor (31), and a conductor (32). The conductor (31) is a conductor that is arranged in an insulating layer (21) of the multilayer body and that extends in a certain shape. The conductor (32) is arranged on a side of an insulating layer (22) of the multilayer body opposite the insulating layer (21). The conductor (32) runs parallel to the conductor (31) and is electromagnetically coupled to the conductor (31). The conductor (32) has a winding shape with one or more rounds, and has a conductor portion (321) and a conductor portion (325) that are arranged adjacent to each other with a spacing in a direction orthogonal to a running parallel direction. In plan view of the multilayer body, the conductor (31) is arranged between the conductor portion (321) and the conductor portion (325).

20 Claims, 13 Drawing Sheets

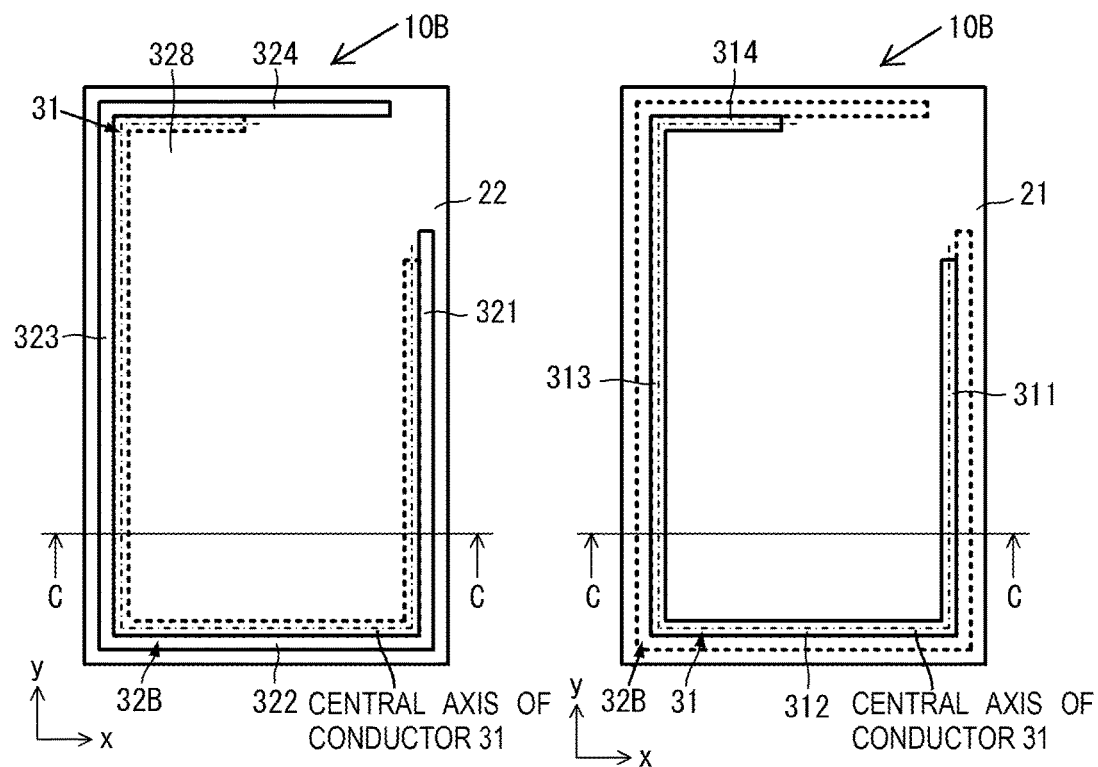
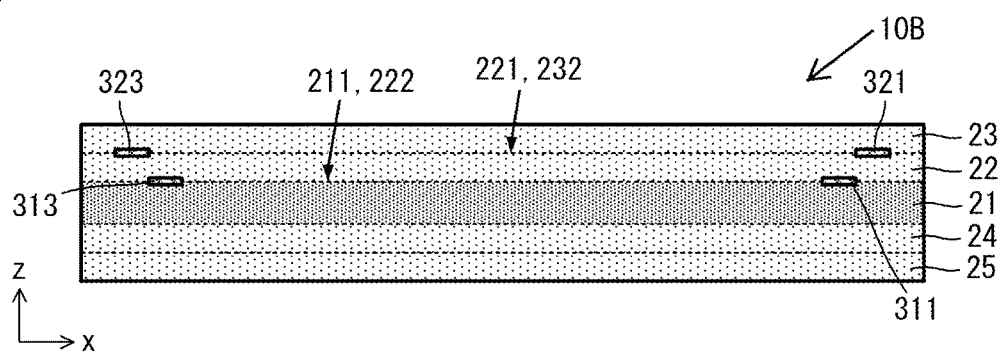

DIRECTIONAL COUPLER

CROSS REFERENCE TO RELATED APPLICATION

This application claims priority from Japanese Patent Application No. 2020-148700 filed on Sep. 4, 2020. The content of this application is incorporated herein by reference in its entirety.

BACKGROUND

The present disclosure relates to a directional coupler including a main line and a sub-line formed on a substrate.

Japanese Unexamined Patent Application Publication No. 2015-177330 describes a directional coupler including a main line and a sub-line formed in a multilayer body. The multilayer body includes a plurality of insulating layers.

The main line and the sub-line are formed on the upper side and the lower side with the insulating layers provided therebetween. The main line and the sub-line are arranged with a certain positional relationship and are electromagnetically coupled to each other.

However, with a conventional configuration as described in Japanese Unexamined Patent Application Publication No. 2015-177330, the main line and the sub-line may not always have the above-mentioned certain positional relationship due to variations during the manufacturing process. In this case, the degree of coupling between the main line and the sub-line changes, resulting in a change in characteristics as the directional coupler.

BRIEF SUMMARY

The present disclosure provides a directional coupler capable of suppressing a change in the degree of coupling between a main line and a sub-line even in the case where the positional relationship between the main line and the sub-line deviates from a designed positional relationship.

A directional coupler according to embodiments of the present disclosure includes a multilayer body, a first conductor, and a second conductor. The multilayer body includes a first insulating layer with a first main surface, and a second insulating layer arranged facing the first main surface. The first conductor is a conductor that is arranged in the first insulating layer and that extends in a certain shape. The second conductor is arranged on a side of the second insulating layer opposite the first insulating layer, runs parallel to the first conductor, and is electromagnetically coupled to the first conductor. The second conductor has a winding shape with one or more rounds, and has a first portion and a second portion that are arranged adjacent to each other with a spacing in a direction orthogonal to a parallel running direction. In plan view of the multilayer body, the first conductor is arranged between the first portion and the second portion.

In this configuration, if the positional relationship between the first conductor and the second conductor changes in a direction orthogonal to a direction in which the first conductor extends (a direction in which the first conductor and the second conductor run parallel to each other), a change in electromagnetic coupling between the first conductor and the first portion of the second conductor and a change in electromagnetic coupling between the first conductor and the second portion of the second conductor become opposite and almost the same. Therefore, a change in electromagnetic coupling between the first conductor and the second conductor is suppressed. That is, one of the first conductor and the second conductor serves as a main line and the other serves as a sub-line, and accordingly, a change in electromagnetic coupling between the main line and the sub-line is suppressed.

According to embodiments of the present disclosure, a change in the degree of electromagnetic coupling between the main line and the sub-line may be suppressed.

Other features, elements, characteristics and advantages of the present disclosure will become more apparent from the following detailed description of embodiments of the present disclosure with reference to the attached drawings.

BRIEF DESCRIPTION OF THE SEVERAL VIEWS OF THE DRAWINGS

FIGS. 11A and 11B are plan views of certain layers of a multilayer body according to the third embodiment;

FIG. 12 is a side sectional view illustrating the configuration of the directional coupler according to the third embodiment;

DETAILED DESCRIPTION

First Embodiment

Figure 1:
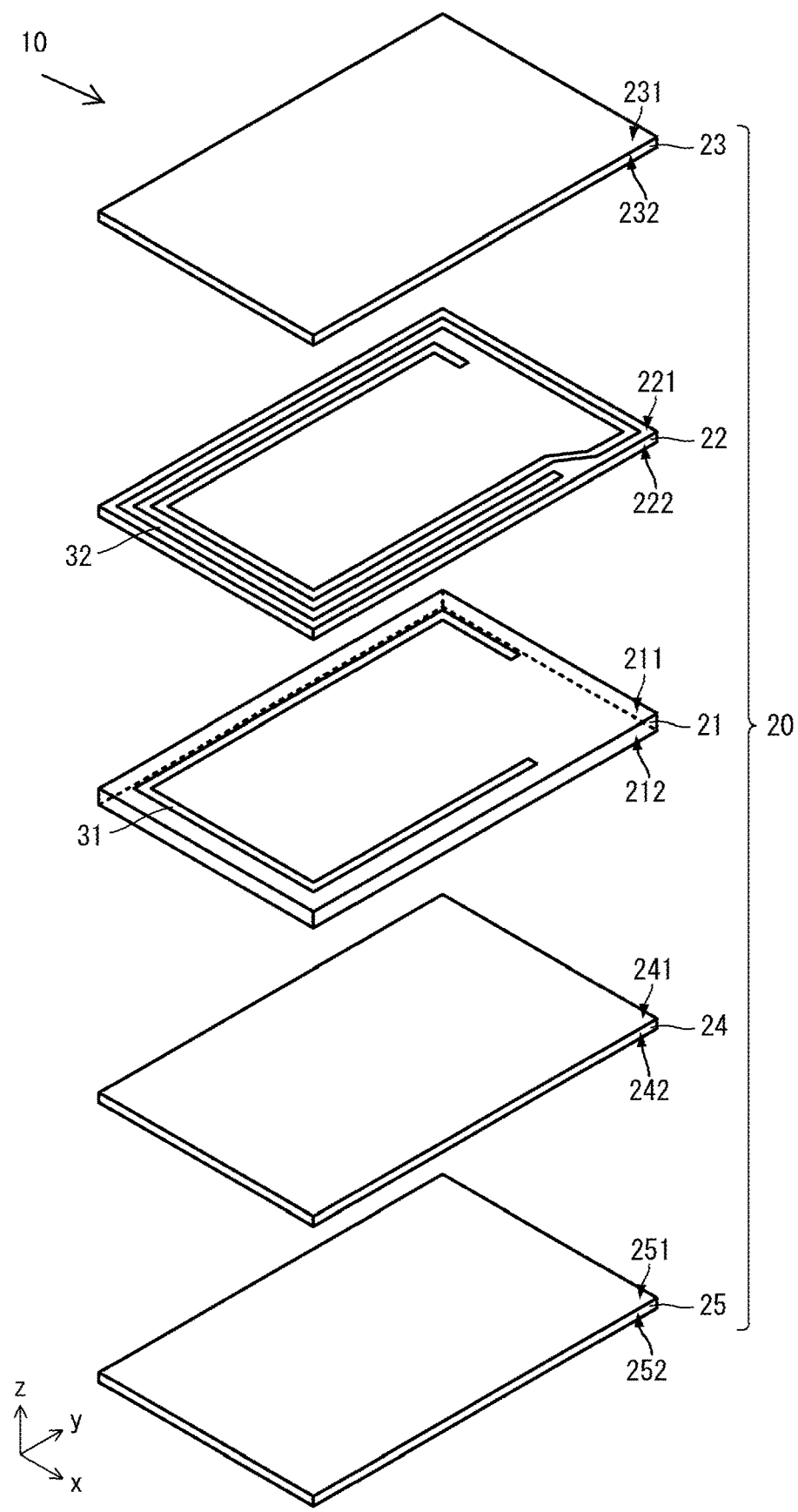
FIG. 1 is an exploded perspective view illustrating the configuration of a directional coupler according to a first embodiment.
Figure 2A:
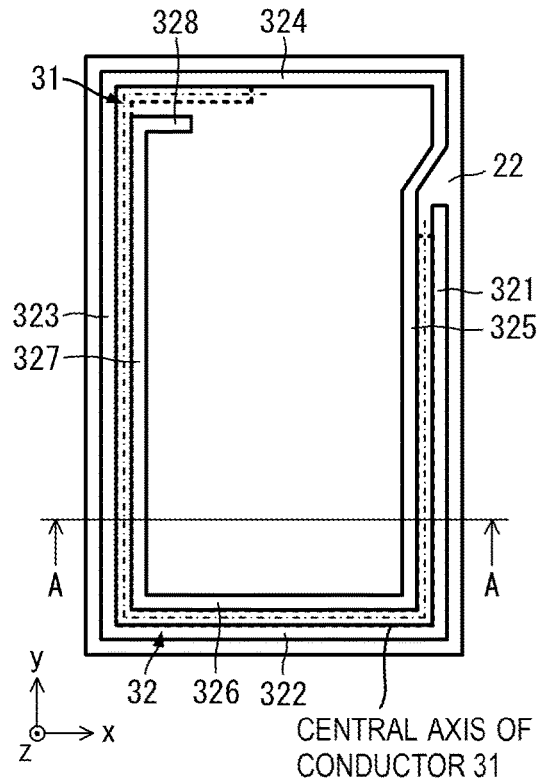
FIGS. 2A and 2B are plan views of certain layers of a multilayer body according to the first embodiment.
Figure 2B:
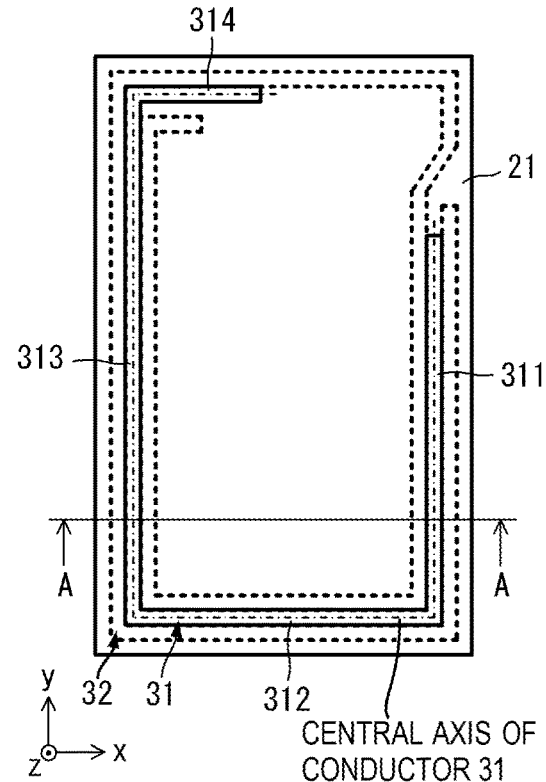
Figure 3:
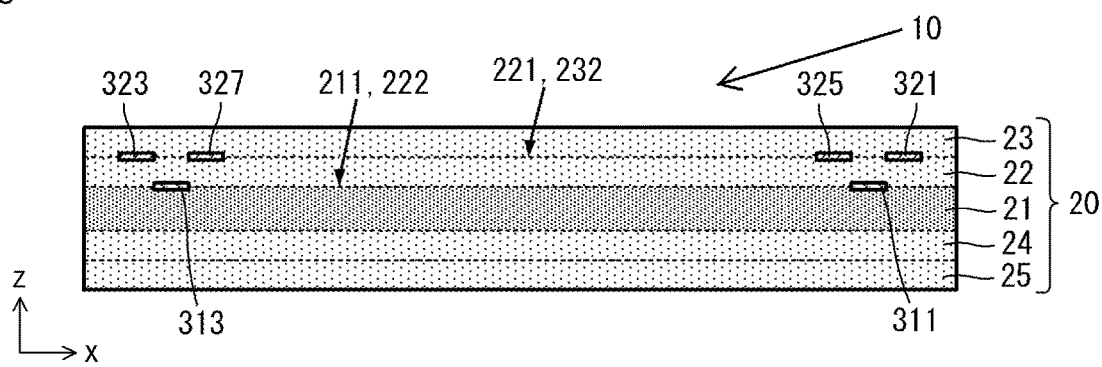
FIG. 3 is a side sectional view illustrating the configuration of the directional coupler according to the first embodiment.

A directional coupler according to a first embodiment of the present disclosure will be described with reference to the drawings. FIG. 1 is an exploded perspective view illustrating the configuration of the directional coupler according to the first embodiment. FIGS. 2A and 2B are plan views of certain layers of a multilayer body according to the first embodiment. FIG. 3 is a side sectional view illustrating the configuration of the directional coupler according to the first embodiment. FIG. 3 illustrates a cross section taken along line A-A in FIGS. 2A and 2B. Note that the shape of each portion is appropriately exaggerated in FIGS. 1, 2A, 2B, and 3 in order to facilitate the understanding of the configuration. Similarly, the shape of each portion is also exaggerated appropriately in the drawings of each embodiment below.

As illustrated in FIGS. 1, 2A, 2B, and 3, a directional coupler 10 includes a multilayer body 20, a conductor 31, and a conductor 32.

The multilayer body 20 includes an insulating layer 21, an insulating layer 22, an insulating layer 23, an insulating layer 24, and an insulating layer 25. That is, the multilayer body 20 has a configuration where the plurality of insulating layers 21 to 25 are laminated. Although the multilayer body 20 includes five layers in the present embodiment, it is only necessary for the multilayer body 20 to include at least two layers, i.e., the insulating layer 21 and the insulating layer 22, and the number of layers may be set as appropriate in accordance with the specification of the directional coupler 10.

The insulating layer 21 is a flat plate with a main surface 211 and a main surface 212. The insulating layer 22 is a flat film with a main surface 221 and a main surface 222, and the insulating layer 23 is a flat film with a main surface 231 and a main surface 232. The insulating layer 24 is a flat film with a main surface 241 and a main surface 242, and the insulating layer 25 is a flat film with a main surface 251 and a main surface 252.

On the main surface 211 side of the insulating layer 21, the insulating layer 22 and the insulating layer 23 are laminated in this order. The insulating layer 22 is arranged on the main surface 211 side of the insulating layer 21. On this occasion, the main surface 222 abuts on the main surface 211 except for a portion where the conductor 31 is arranged. The insulating layer 23 is arranged on the main surface 221 side of the insulating layer 22. On this occasion, the main surface 232 abuts on the main surface 221 except for a portion where the conductor 32 is arranged.

On the main surface 212 side of the insulating layer 21, the insulating layer 24 and the insulating layer 25 are laminated in this order. The insulating layer 24 abuts on the main surface 212 of the insulating layer 21. On this occasion, the main surface 241 abuts on the main surface 212. The insulating layer 25 abuts on the main surface 242 of the insulating layer 24. On this occasion, the main surface 251 abuts on the main surface 242.

The insulating layer 21 is a core material layer, and the insulating layer 22, the insulating layer 23, the insulating layer 24, and the insulating layer 25 are prepreg layers. That is, the multilayer body 20 is formed by sequentially laminating the insulating layer 22 and the insulating layer 23 on the main surface 211 side of the insulating layer 21, which is a core material, sequentially laminating the insulating layer 24 and the insulating layer 25 on the main surface 212 side of the insulating layer 21, and applying heat and pressure to layers 21 to 25.

Note that the core material layer is a flat plate with a certain rigid body before heat and pressure are applied, and the prepreg layers are semi-cured flat films before heat and pressure are applied (laminated state). By heating and pressing, the prepreg layers are melted and welded to their adjacent insulating layers. After that, the prepreg layers are cooled and cured, thereby forming the multilayer body 20. That is, the prepreg layers may be of any kind as long as they are more easily melted by heating and pressing than the core material layer. The core material layer and the prepreg layers may have, for example, the same main component, but have different compositions of other contained materials, or may have the same components but have different thicknesses. The core material layer and the prepreg layers may be realized by glass epoxy resin, resin, or the like. For example, in the case where the multilayer body 20 is formed by an odd number of insulating layers, the center layer among these odd number of insulating layers may serve as a core material layer, and layers other than the center layer may serve as prepreg layers.

The conductor 31 and the conductor 32 are substantially linear conductors. The conductor 31 and the conductor 32 may be realized by, for example, copper or the like. The conductor 31 corresponds to a "first conductor" of embodiments of the present disclosure, and the conductor 32 corresponds to a "second conductor" of embodiments of the present disclosure.

The conductor 31 is arranged on the main surface 211 of the insulating layer 21. In other words, the conductor 31 is arranged at a boundary where the insulating layer 21 and the insulating layer 22 abut each other.

The conductor 31 is a conductor that extends in a certain shape. More specifically, the conductor 31 has a substantially winding shape with approximately one round, and as illustrated in FIG. 2B, has a conductor portion 311, a conductor portion 312, a conductor portion 313, and a conductor portion 314. The conductor portion 311, the conductor portion 312, the conductor portion 313, and the conductor portion 314 are connected in this order. Note that a substantially winding shape of embodiments of the present disclosure does not have to be a perfect ring shape, but is a shape that at least has part of a ring shape. A substantially winding shape of embodiments of the present disclosure can be a shape with three or more substantially straight line portions, and these three or more substantially straight line portions are bent at an angle other than 0 degrees (180 degrees) and are sequentially connected. A substantially winding shape of embodiments of the present disclosure can be a shape where, among the three or more substantially straight line portions, two substantially straight line portions that are not directly connected are substantially parallel to each other.

The conductor portion 311 and the conductor portion 313 are arranged at a distance in the x-direction orthogonal to the y-direction, which is the thickness direction of the multilayer body 20, and are in a substantially straight line shape extending in the y-direction orthogonal to the z-direction and the x-direction. The conductor portion 312 and the conductor portion 314 are arranged at a distance in the y-direction, and are in a substantially straight line shape extending in the x-direction. With such a shape, the conductor 31 realizes a substantially winding shape with approximately one round.

The conductor 32 is arranged on the main surface 221 of the insulating layer 22. In other words, the conductor 32 is arranged at a boundary where the insulating layer 22 and the insulating layer 23 abut each other. In other words, the conductor 32 is arranged opposite to the conductor 31 with the insulating layer 22 interposed therebetween.

The conductor 32 has a substantially winding shape with approximately two rounds, and as illustrated in FIG. 2A, has a conductor portion 321, a conductor portion 322, a conductor portion 323, a conductor portion 324, a conductor portion 325, a conductor portion 326, a conductor portion 327, and a conductor portion 328. The conductor portion 321, the conductor portion 322, the conductor portion 323, the conductor portion 324, the conductor portion 325, the conductor portion 326, the conductor portion 327, and the conductor portion 328 are connected in this order.

The conductor portion 321, the conductor portion 323, the conductor portion 325, and the conductor portion 327 are in a substantially straight line shape extending in the y-direction. The conductor portion 321 and the conductor portion 325 are adjacent to each other and run parallel to each other, and the conductor portion 323 and the conductor portion 327 are adjacent to each other and run parallel to each other. A portion where the conductor portion 321 and the conductor portion 325 are adjacent to each other and run parallel to each other and a portion where the conductor portion 323 and the conductor portion 327 are adjacent to each other and run parallel to each other are arranged at a distance in the x-direction. The conductor portion 327 is arranged closer to the conductor portion 325 than the conductor portion 323 is, and the conductor portion 325 is arranged closer to the conductor portion 327 than the conductor portion 321 is.

The conductor portion 322, the conductor portion 324, the conductor portion 326, and the conductor portion 328 are in a substantially straight line shape extending in the x-direction. The conductor portion 322 and the conductor portion 326 are adjacent to each other and run parallel to each other, and the conductor portion 324 and the conductor portion 328 are adjacent to each other and run parallel to each other. A portion where the conductor portion 322 and the conductor portion 326 are adjacent to each other and run parallel to each other and a portion where the conductor portion 324 and the conductor portion 328 are adjacent to each other and run parallel to each other are arranged at a distance in the y-direction. The conductor portion 328 is arranged closer to the conductor portion 326 than the conductor portion 324 is, and the conductor portion 328 is arranged closer to the conductor portion 326 than the conductor portion 324 is. With such a shape, the conductor 32 realizes a substantially winding shape with approximately two rounds, that is, a substantially winding shape with one or more rounds which at least has a portion where two conductor portions run parallel to each other.

Note that a set of the conductor portion 321 and the conductor portion 325 corresponds to a set of a "first portion" and a "second portion" of embodiments of the present disclosure. Alternatively, a set of the conductor portion 323 and the conductor portion 327 corresponds to a set of a "first portion" and a "second portion" of embodiments of the present disclosure. In addition, a set of the conductor portion 322 and the conductor portion 326 also corresponds to a set of a "first portion" and a "second portion" of embodiments of the present disclosure. Furthermore, the conductor portion 321 and the conductor portion 323 correspond to a set of a "fifth portion" and a "sixth portion" of embodiments of the present disclosure, and the conductor portion 323 and the conductor portion 327 correspond to a set of a "fifth portion" and a "sixth portion" of embodiments of the present disclosure.

Figure 4:
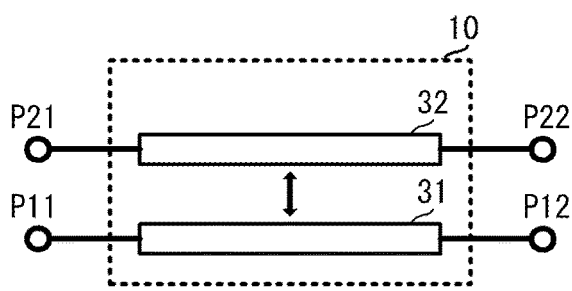
FIG. 4 is an equivalent circuit diagram of the directional coupler according to the first embodiment.

In such a configuration, since the conductor 31 and the conductor 32 are arranged close to each other, certain electromagnetic coupling is realized between the conductor 31 and the conductor 32. Accordingly, the directional coupler 10 realizes a circuit as illustrated in FIG. 4. FIG. 4 is an equivalent circuit diagram of the directional coupler according to the first embodiment.

As illustrated in FIG. 4, the directional coupler 10 includes the conductor 31 and the conductor 32. The conductor 31 and the conductor 32 run parallel to each other at a certain distance and are electromagnetically coupled to each other. With this configuration, for example, by having the conductor 31 as a main line and the conductor 32 as a sub-line, some of radio frequency (RF) signals transmitted between an input/output terminal P11 and an input/output terminal P12 flow between an input/output terminal P21 and an input/output terminal P22. In contrast, by having the conductor 32 as a main line and the conductor 31 as a sub-line, some of RF signals transmitted between the input/output terminal P21 and the input/output terminal P22 flow between the input/output terminal P11 and the input/output terminal P12. Note that running parallel to each other at a certain distance includes not only the case where one and the other run parallel to each other while maintaining exactly the same distance, but also the case where one and the other run parallel to each other while maintaining substantially the same distance (for example, the case where one and the other run parallel to each other while the distance between the two changes within the range of ±10%). Here, ±10%, which is an error in distance, may also be set appropriately according to manufacturing errors, the tolerance of characteristics, or the like.

Therefore, this circuit functions as a directional coupler where one of the conductor 31 and the conductor 32 serves as a main line and the other serves as a sub-line. On this occasion, by setting a distance at which the two run parallel to each other to a certain length (such as approximately ¼ of the wavelength of an RF signal), the frequency of a to-be-electromagnetically-coupled RF signal may be determined.

More Specific Positional Relationship Between Conductor 31 and Conductor 32

Figure 5A:
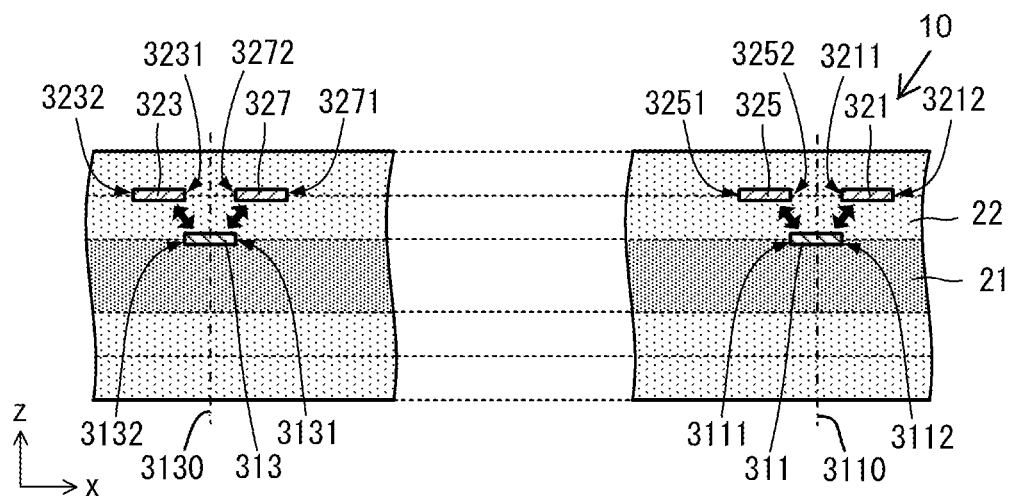
FIGS. 5A, 5B, and 5C are side sectional views illustrating the state of electromagnetic coupling between a main-line conductor and a sub-line conductor in the configuration of the first embodiment.
Figure 5B:
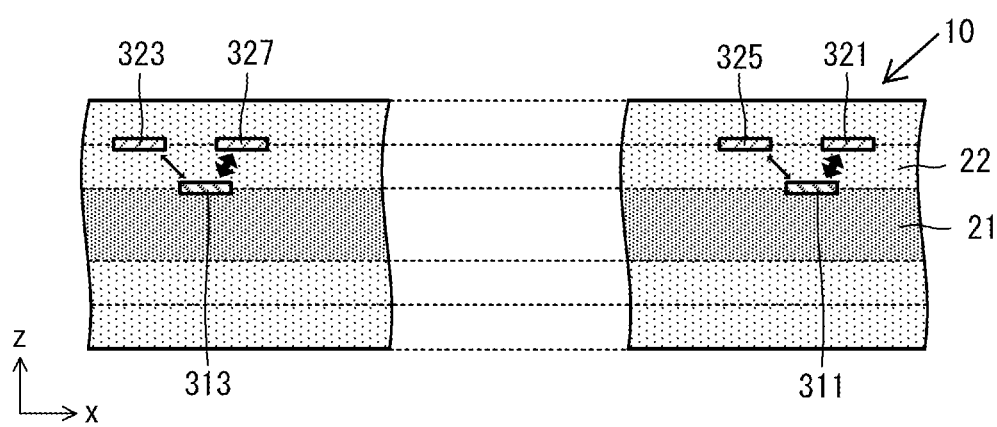
Figure 5C:
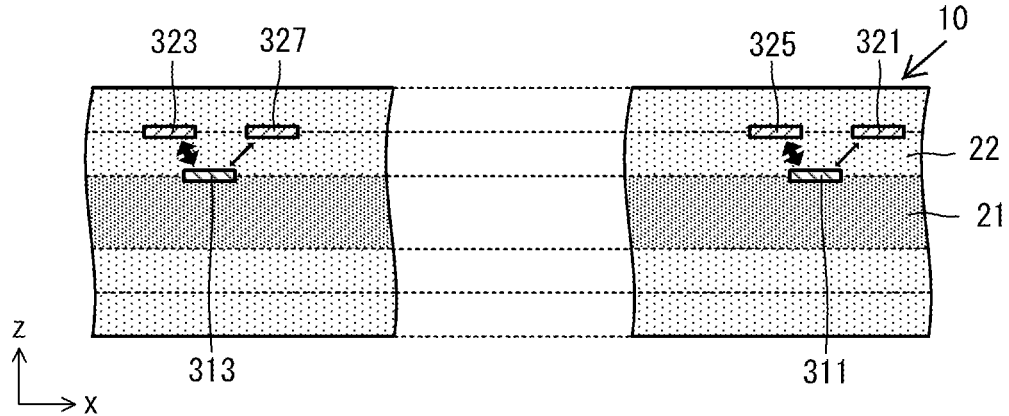

FIGS. 5A, 5B, and 5C are side sectional views illustrating the state of electromagnetic coupling between the main-line conductor and the sub-line conductor in the configuration of the first embodiment. FIGS. 5A, 5B, and 5C each illustrate a cross section taken along line A-A in FIGS. 2A and 2B. FIG. 5A illustrates the case in which the main-line conductor and the sub-line conductor have a positional relationship as designed, and FIGS. 5B and 5C each illustrate the case in which the main-line conductor and the sub-line conductor have a positional relationship deviated from one as designed. The directions of deviation are opposite in FIGS. 5B and 5C.

Positional Relationship of Conductor Portion 311 with Conductor Portion 321 and Conductor Portion 325

As illustrated in FIGS. 2A, 2B, and 3, when the multilayer body 20 is viewed in plan (viewed in the z-direction), the conductor portion 311 of the conductor 31 is arranged between the conductor portion 321 and the conductor portion 325 of the conductor 32. More specifically, the conductor portion 311 has a positional relationship with the conductor portion 321 and the conductor portion 325 as illustrated in FIG. 5A.

The conductor portion 311 has a side end face 3111 and a side end face 3112. A side end face refers to a face connecting a conductor's faces facing an insulating layer (faces provided in the Z-direction). The side end face 3111 is a side end face closer to the conductor portion 325 than the side end face 3112 is, and the side end face 3112 is a side end face closer to the conductor portion 321 than the side end face 3111 is.

The conductor portion 321 has a side end face 3211 and a side end face 3212. The side end face 3211 is a side end face facing conductor portion 325. The conductor portion 325 has a side end face 3251 and a side end face 3252. The side end face 3252 is a side end face facing the conductor portion 321.

The above-mentioned conductor portion 311 being arranged between the conductor portion 321 and the conductor portion 325 is, more specifically, that the side end face 3111 of the conductor portion 311 is arranged closer to the conductor portion 321 than the side end face 3251 of the conductor portion 325 is, and the side end face 3112 of the conductor portion 311 is arranged closer to the conductor portion 325 than the side end face 3212 of the conductor portion 321 is.

In this configuration, when the above-mentioned multilayer body 20 is formed, the insulating layer 22 including a prepreg layer is melted. Thus, as illustrated in FIG. 5B or FIG. 5C, the position of the conductor portion 321 or the conductor portion 325 may deviate in the x-direction.

For example, in the case of FIG. 5B, the conductor portion 321 and the conductor portion 325 are such that, in plan view of the multilayer body 20, the conductor portion 321 becomes closer to the conductor portion 311 and the conductor portion 325 becomes farther away from the conductor portion 311. In this case, the electromagnetic coupling between the conductor portion 311 and the conductor portion 321 increases, and the electromagnetic coupling between the conductor portion 311 and the conductor portion 325 decreases. Accordingly, the coupling obtained by adding the electromagnetic coupling between the conductor portion 311 and the conductor portion 321 and the electromagnetic coupling between the conductor portion 311 and the conductor portion 325, i.e., the coupling in a portion where the conductor portion 321 and the conductor portion 325 are close to and run parallel to the conductor portion 311, hardly changes from the coupling in a portion where the conductor portion 321 and the conductor portion 325 are close to and run parallel to the conductor portion 311 in the case illustrated in FIG. 5A. That is, a change in electromagnetic coupling between the conductor 31 and the conductor 32 due to a deviation of the conductor 32 may be suppressed.

In addition, in the case of FIG. 5C, the conductor portion 321 and the conductor portion 325 are such that, in plan view of the multilayer body 20, the conductor portion 325 becomes closer to the conductor portion 311 and the conductor portion 321 becomes farther away from the conductor portion 311. In this case, the electromagnetic coupling between the conductor portion 311 and the conductor portion 325 increases, and the electromagnetic coupling between the conductor portion 311 and the conductor portion 321 decreases. Accordingly, the coupling obtained by adding the electromagnetic coupling between the conductor portion 311 and the conductor portion 321 and the electromagnetic coupling between the conductor portion 311 and the conductor portion 325, i.e., the coupling in a portion where the conductor portion 321 and the conductor portion 325 are close to and run parallel to the conductor portion 311, hardly changes from the coupling in a portion where the conductor portion 321 and the conductor portion 325 are close to and run parallel to the conductor portion 311 in the case illustrated in FIG. 5A. That is, a change in electromagnetic coupling between the conductor 31 and the conductor 32 due to a deviation of the conductor 32 may be suppressed.

Although the conductor portion 321 and the conductor portion 325 have the same distance in the x-direction to a central axis 3110 of the conductor portion 311 in its extending direction in FIG. 5A, this is not the only possible case. That is, it is only necessary that, when the insulating layer 22 is deformed, the conductor portion 311 have a positional relationship and a shape such that the electromagnetic coupling with the conductor portion 325 decreases in the case where the electromagnetic coupling with the conductor portion 321 increases, and the electromagnetic coupling with the conductor portion 321 decreases in the case where the electromagnetic coupling with the conductor portion 325 increases.

Positional Relationship of Conductor Portion 313 with Conductor Portion 323 and Conductor Portion 327

As illustrated in FIGS. 2A, 2B, and 3, when the multilayer body 20 is viewed in plan (viewed in the z-direction), the conductor portion 313 of the conductor 31 is arranged between the conductor portion 323 and the conductor portion 327 of the conductor 32. More specifically, the conductor portion 313 has a positional relationship with the conductor portion 323 and the conductor portion 327 as illustrated in FIG. 5A.

The conductor portion 313 has a side end face 3131 and a side end face 3132. The side end face 3131 is a side end face closer to the conductor portion 327 than the side end face 3132 is, and the side end face 3132 is a side end face closer to the conductor portion 323 than the side end face 3131 is.

The conductor portion 323 has a side end face 3231 and a side end face 3232. The side end face 3231 is a side end face facing the conductor portion 327. The conductor portion 327 has a side end face 3271 and a side end face 3272. The side end face 3272 is a side end face facing the conductor portion 323.

The above-mentioned conductor portion 313 being arranged between the conductor portion 323 and the conductor portion 327 is, more specifically, that the side end face 3131 of the conductor portion 313 is arranged closer to the conductor portion 323 than the side end face 3271 of the conductor portion 327 is, and the side end face 3132 of the conductor portion 313 is arranged closer to the conductor portion 327 than the side end face 3232 of the conductor portion 323 is.

In this configuration, when the above-mentioned multilayer body 20 is formed, the insulating layer 22 including a prepreg layer is melted. Thus, as illustrated in FIG. 5B or FIG. 5C, the position of the conductor portion 323 or the conductor portion 327 may deviate in the x-direction.

For example, in the case of FIG. 5B, the conductor portion 327 becomes closer to the conductor portion 313 and the conductor portion 323 becomes farther away from the conductor portion 313. In this case, the electromagnetic coupling between the conductor portion 313 and the conductor portion 327 increases, and the electromagnetic coupling between the conductor portion 313 and the conductor portion 323 decreases. Accordingly, the coupling obtained by adding the electromagnetic coupling between the conductor portion 313 and the conductor portion 327 and the electromagnetic coupling between the conductor portion 313 and the conductor portion 323, i.e., the coupling in a portion where the conductor portion 323 and the conductor portion 327 are close to and run parallel to the conductor portion 313, hardly changes from the coupling in a portion where the conductor portion 323 and the conductor portion 327 are close to and run parallel to the conductor portion 313 in the case illustrated in FIG. 5A. That is, a change in electromagnetic coupling between the conductor 31 and the conductor 32 due to a deviation of the conductor 32 may be suppressed.

In addition, in the case of FIG. 5C, the conductor portion 323 becomes closer to the conductor portion 313 and the conductor portion 327 becomes farther away from the conductor portion 313. In this case, the electromagnetic coupling between the conductor portion 313 and the conductor portion 323 increases, and the electromagnetic coupling between the conductor portion 313 and the conductor portion 327 decreases. Accordingly, the coupling obtained by adding the electromagnetic coupling between the conductor portion 313 and the conductor portion 323 and the electromagnetic coupling between the conductor portion 313 and the conductor portion 327, i.e., the coupling in a portion where the conductor portion 323 and the conductor portion 327 are close to and run parallel to the conductor portion 313, hardly changes from the coupling in a portion where the conductor portion 323 and the conductor portion 327 are close to and run parallel to the conductor portion 313 in the case illustrated in FIG. 5A. That is, a change in electromagnetic coupling between the conductor 31 and the conductor 32 due to a deviation of the conductor 32 may be suppressed.

Although the conductor portion 323 and the conductor portion 327 have the same distance in the x-direction to a central axis 3130 of the conductor portion 313 in its extending direction in FIG. 5A, this is not the only possible case. That is, it is only necessary that, when the insulating layer 22 is deformed, the conductor portion 313 have a positional relationship and a shape such that the electromagnetic coupling with the conductor portion 327 decreases in the case where the electromagnetic coupling with the conductor portion 323 increases, and the electromagnetic coupling with the conductor portion 323 decreases in the case where the electromagnetic coupling with the conductor portion 327 increases.

Although a detailed illustration is omitted, a configuration that is the same as or similar to the above-described configuration is also adopted in a portion where the conductor portion 312 is close to and runs parallel to the conductor portion 322 and the conductor portion 326. Accordingly, a change in electromagnetic coupling in this portion due to a deviation of the insulating layer 22 in the y-direction may be suppressed.

Positional Relationship Combining Positional Relationship Between Conductor Portion 311 and Conductor Portion 321 and Positional Relationship Between Conductor Portion 313 and Conductor Portion 323

As illustrated in FIGS. 2A, 2B, 3, and 5A, the conductor portion 321 of the conductor 32 is arranged outside the central axis 3110 (see FIG. 5A) of the conductor portion 311 in its extending direction (outside the substantially winding shape formed by the conductor 31 (outside the central aperture)). The conductor portion 323 of the conductor 32 is arranged outside the central axis 3130 (see FIG. 5A) of the conductor portion 313 in its extending direction (outside the substantially winding shape formed by the conductor 31). That is, the conductor portion 321 and the conductor portion 323 of the conductor 32 are arranged on the same side with respect to the central axis (see FIGS. 2A and 2B) of the conductor 31 in its extending direction (outside the substantially winding shape formed by the conductor 31).

With this configuration, for example, in response to a deviation as illustrated in FIG. 5B described above (a change in the positional relationship in the x-direction), in plan view of the multilayer body 20, the conductor portion 321 becomes closer to the conductor portion 311 and the conductor portion 323 becomes farther away from the conductor portion 313. In this case, the electromagnetic coupling between the conductor portion 311 and the conductor portion 321 increases, and the electromagnetic coupling between the conductor portion 313 and the conductor portion 323 decreases. Accordingly, a change in electromagnetic coupling between the conductor 31 and the conductor 32 due to a deviation of the conductor 32 may be suppressed.

In addition, in response to a deviation as illustrated in FIG. 5C, in plan view of the multilayer body 20, the conductor portion 321 becomes farther away from the conductor portion 311 and the conductor portion 323 becomes closer to the conductor portion 313. In this case, the electromagnetic coupling between the conductor portion 311 and the conductor portion 321 decreases, and the electromagnetic coupling between the conductor portion 313 and the conductor portion 323 increases. Accordingly, a change in electromagnetic coupling between the conductor 31 and the conductor 32 due to a deviation of the conductor 32 may be suppressed.

Positional Relationship Combining Positional Relationship Between Conductor Portion 311 and Conductor Portion 325 and Positional Relationship Between Conductor Portion 313 and Conductor Portion 327

As illustrated in FIGS. 2A, 2B, 3, and 5A, the conductor portion 325 of the conductor 32 is arranged inside the central axis 3110 (see FIG. 5A) of the conductor portion 311 in its extending direction (inside the substantially winding shape formed by the conductor 31 (inside the central aperture)). The conductor portion 327 of the conductor 32 is arranged inside the central axis 3130 (see FIG. 5A) of the conductor portion 313 in its extending direction (inside the substantially winding shape formed by the conductor 31). That is, the conductor portion 325 and the conductor portion 327 of the conductor 32 are arranged on the same side with respect to the central axis (see FIGS. 2A and 2B) of the conductor 31 in its extending direction (inside the substantially winding shape formed by the conductor 31).

With this configuration, for example, in response to a deviation as illustrated in FIG. 5B described above, in plan view of the multilayer body 20, the conductor portion 325 becomes farther away from the conductor portion 311 and the conductor portion 327 becomes closer to the conductor portion 313. In this case, the electromagnetic coupling between the conductor portion 311 and the conductor portion 325 decreases, and the electromagnetic coupling between the conductor portion 313 and the conductor portion 327 increases. Accordingly, a change in electromagnetic coupling between the conductor 31 and the conductor 32 due to a deviation of the conductor 32 may be suppressed.

In addition, in response to a deviation as illustrated in FIG. 5C, in plan view of the multilayer body 20, the conductor portion 325 becomes closer to the conductor portion 311 and the conductor portion 327 becomes farther away from the conductor portion 313. In this case, the electromagnetic coupling between the conductor portion 311 and the conductor portion 325 increases, and the electromagnetic coupling between the conductor portion 313 and the conductor portion 327 decreases. Accordingly, a change in electromagnetic coupling between the conductor 31 and the conductor 32 due to a deviation of the conductor 32 may be suppressed.

As described above, the directional coupler 10 may suppress a change in electromagnetic coupling between a plurality of electromagnetically coupled conductors (main line and sub-line) even in response to a change in the positional relationship between the plurality of conductors (main line and sub-line). In other words, the directional coupler 10 may desensitize a change in electromagnetic coupling between a plurality of electromagnetically coupled conductors (main line and sub-line) in response to a change in the positional relationship between the plurality of conductors (main line and sub-line).

In addition, because the conductor 31 and the conductor 32 each have a substantially winding shape in the directional coupler 10, the shape of the directional coupler 10 may be made smaller with respect to a to-be-coupled frequency.

Second Embodiment

Figure 6:
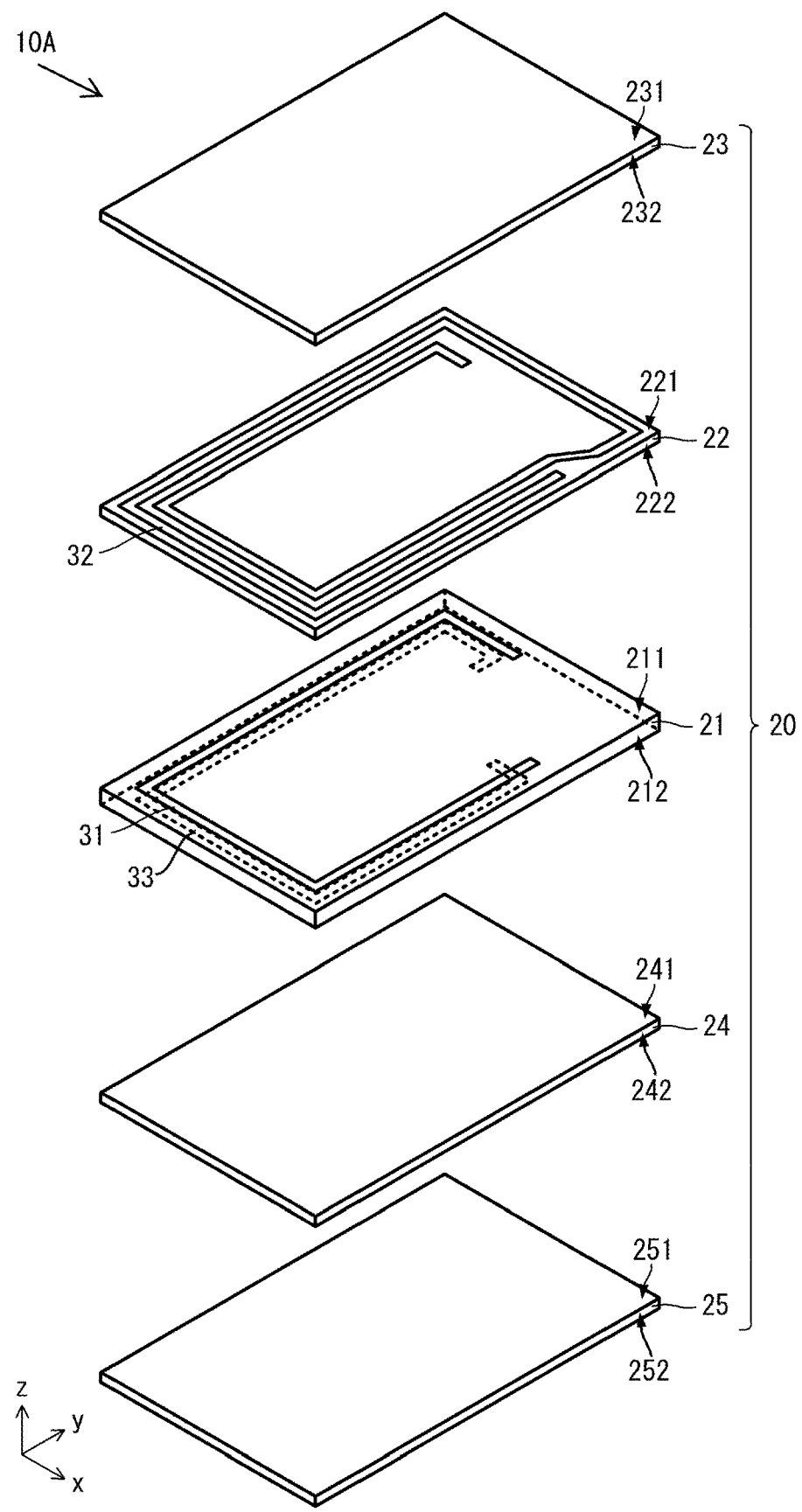
FIG. 6 is an exploded perspective view illustrating the configuration of a directional coupler according to a second embodiment.
Figure 7A:
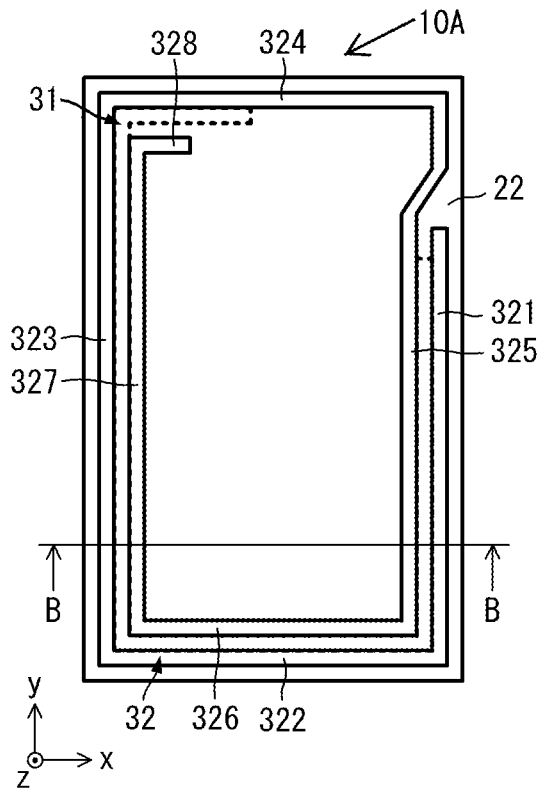
FIGS. 7A, 7B, and 7C are plan views of certain layers of a multilayer body according to the second embodiment.
Figure 7B:
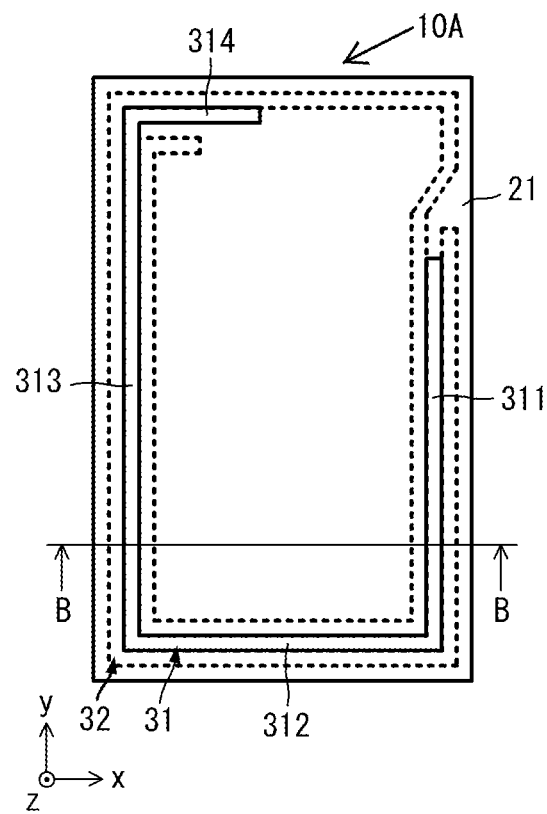
Figure 7C:
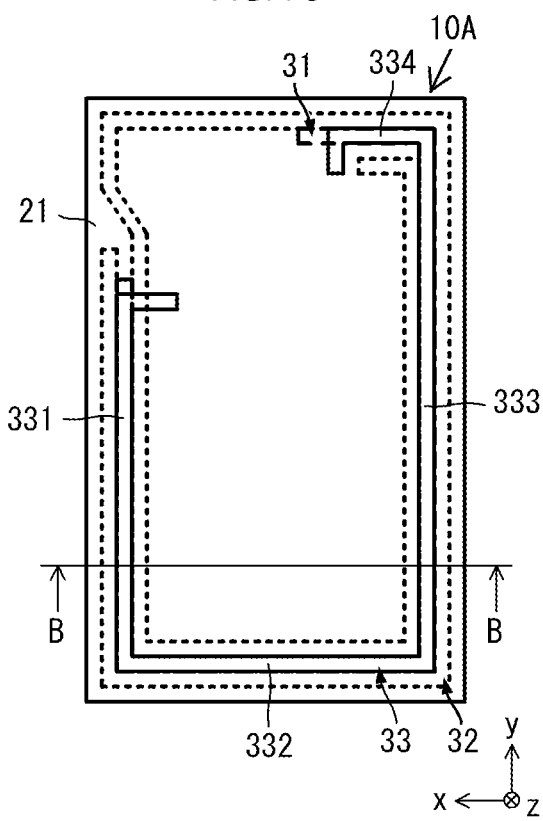
Figure 8:
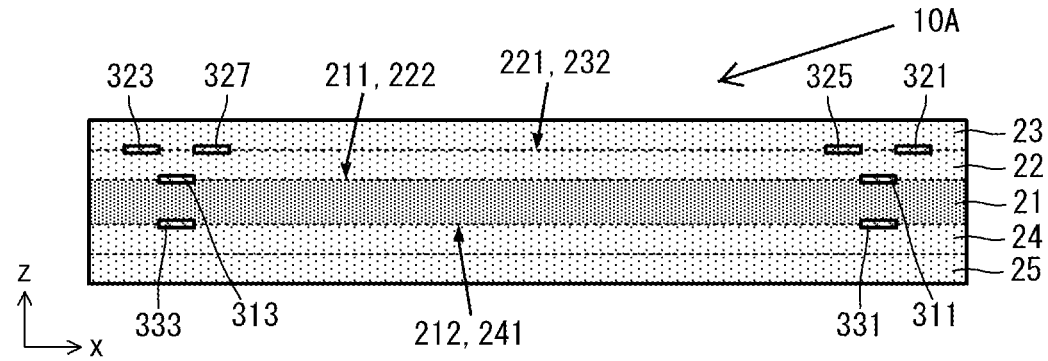
FIG. 8 is a side sectional view illustrating the configuration of the directional coupler according to the second embodiment.

A directional coupler according to a second embodiment of the present disclosure will be described with reference to the drawings. FIG. 6 is an exploded perspective view illustrating the configuration of the directional coupler according to the second embodiment. FIGS. 7A, 7B, and 7C are plan views of certain layers of a multilayer body according to the second embodiment. FIG. 8 is a side sectional view illustrating the configuration of the directional coupler according to the second embodiment. FIG. 8 illustrates a cross section taken along line B-B in FIGS. 7A, 7B, and 7C.

As illustrated in FIGS. 6, 7A, 7B, 7C, and 8, a directional coupler 10A according to the second embodiment is different from the directional coupler 10 according to the first embodiment in the point that a conductor 33 is added. The rest of the configuration of the directional coupler 10A is the same as or similar to the directional coupler 10, and descriptions of the same or similar portions are omitted.

The directional coupler 10A includes the conductor 33. The conductor 33 is arranged on the main surface 212 of the insulating layer 21. In other words, the conductor 33 is arranged at a boundary where the insulating layer 21 and the insulating layer 24 abut each other. That is, the conductor 33 is arranged opposite to the conductor 31 with the insulating layer 21, which is a core material layer, interposed therebetween. The conductor 33 corresponds to a "third conductor" of embodiments of the present disclosure.

The conductor 33 has a substantially winding shape with approximately one round, and as illustrated in FIG. 7C, has a conductor portion 331, a conductor portion 332, a conductor portion 333, and a conductor portion 334. The conductor portion 331, the conductor portion 332, the conductor portion 333, and the conductor portion 334 are connected in this order.

The conductor portion 331 and the conductor portion 333 are arranged at a distance in the x-direction, and are in a substantially straight line shape extending in the y-direction. The conductor portion 332 and the conductor portion 334 are arranged at a distance in the y-direction, and are in a substantially straight line shape extending in the x-direction. With such a shape, the conductor 33 realizes a substantially winding shape with approximately one round.

As illustrated in FIGS. 7B, 7C, and 8, in plan view of the multilayer body 20, the conductor portion 331 overlaps and runs parallel to the conductor portion 311. The conductor portion 333 overlaps and runs parallel to the conductor portion 313. In addition, as illustrated in FIGS. 7B and 7C, the conductor portion 332 overlaps and runs parallel to the conductor portion 312. The conductor portion 334 overlaps and runs parallel to the conductor portion 314.

With this configuration, the conductor 33 is close to and runs parallel to the conductor 31 at a certain length. Accordingly, the conductor 33 and the conductor 31 are electromagnetically coupled to each other. By adjusting the distance at which the conductor 33 and the conductor 31 run parallel to each other, the frequency of a to-be-coupled RF signal may be determined.

In this manner, the directional coupler 10A has a configuration where the conductor 32 and the conductor 33 are each electromagnetically coupled to the conductor 31. Therefore, the directional coupler 10A having the conductor 31 as a main line and the conductor 32 and the conductor 33 as a first sub-line and a second sub-line, respectively, may be realized.

Distances at which the conductor 32 and the conductor 33 run parallel to the conductor 31 are made different. Accordingly, the frequencies of to-be-coupled RF signals may be made different. Therefore, the directional coupler 10A may extract some of RF signals at a plurality of frequencies.

Here, the conductor 33 is coupled to the conductor 31 only with the insulating layer 21, which is a core material layer, interposed therebetween. Therefore, the positional relationship between the conductor 31 and the conductor 33 hardly changes due to application of heat and pressure at the time of forming the multilayer body 20. Using this, in the directional coupler 10A the conductor 33 can handle RF signals susceptible to the degree of coupling. For example, the length of the conductor 33 is made shorter than the length of the conductor 32, thereby making the frequency of an RF signal coupled with the conductor 33 higher than the frequency of an RF signal coupled with the conductor 32.

In such a configuration, the directional coupler 10A may extract RF signals at a plurality of frequencies and suppress a change in performance as a directional coupler in each of the RF signals. In addition, the directional coupler 10A may suppress a change in the balance of the degree of coupling of RF signals at a plurality of frequencies, thereby realizing excellent performance as a directional coupler.

Also, since the conductor 32 and the conductor 33 are arranged with the conductor 31 interposed therebetween in this configuration, the planar area may be made smaller than that in the case where the conductor 32 and the conductor 33 are formed in the same layer. In addition, the degree of coupling between the conductor 31 and the conductor 32 and the degree of coupling between the conductor 31 and the conductor 33 have an improved degree of freedom. That is, the degree of freedom in designing the conductor 32 and the conductor 33 is improved. Furthermore, the electromagnetic coupling between the conductor 32 and the conductor 33 may be suppressed.

Figure 7D:
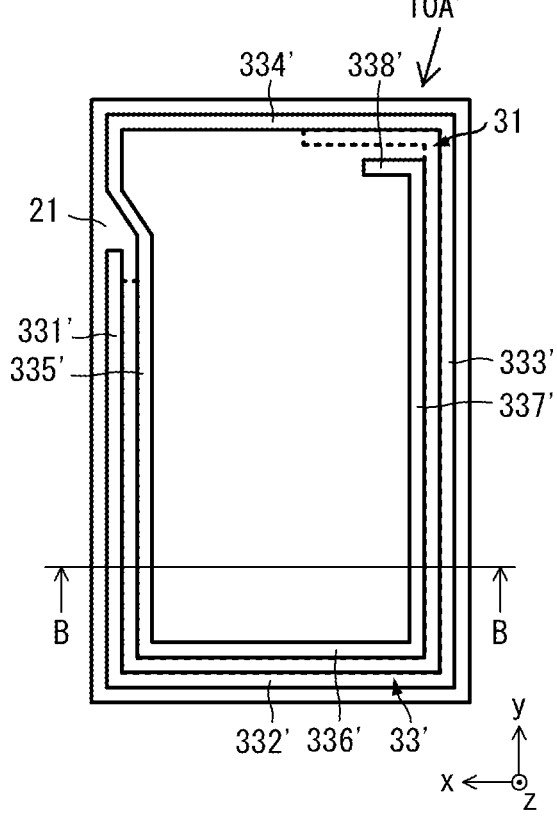
FIG. 7D is a plan view of certain layers of a multilayer body in a derivative example of the directional coupler according to the second embodiment.

Also, in this configuration, the case in which the conductor 33 has a substantially winding shape with approximately one round is discussed. However, a configuration as illustrated in FIG. 7D is also possible. FIG. 7D is a plan view of certain layers of a multilayer body in a derivative example of the directional coupler according to the second embodiment. A directional coupler 10A' illustrated in FIG. 7D has the same configuration as the directional coupler 10A except for a conductor 33'. Like the conductor 32, the conductor 33' has a substantially winding shape with approximately one or more rounds, and has the shape where a conductor portion 331', a conductor portion 332', a conductor portion 333', a conductor portion 334', a conductor portion 335', a conductor portion 336', a conductor portion 337', and a conductor portion 338' are sequentially connected. In this case, conductor portions of the conductor 33 that are arranged with the central axis of the conductor 31 interposed therebetween correspond to a "seventh portion" and an "eighth portion" of embodiments of the present disclosure.

Usage Example of Directional Coupler 10A

Figure 9:
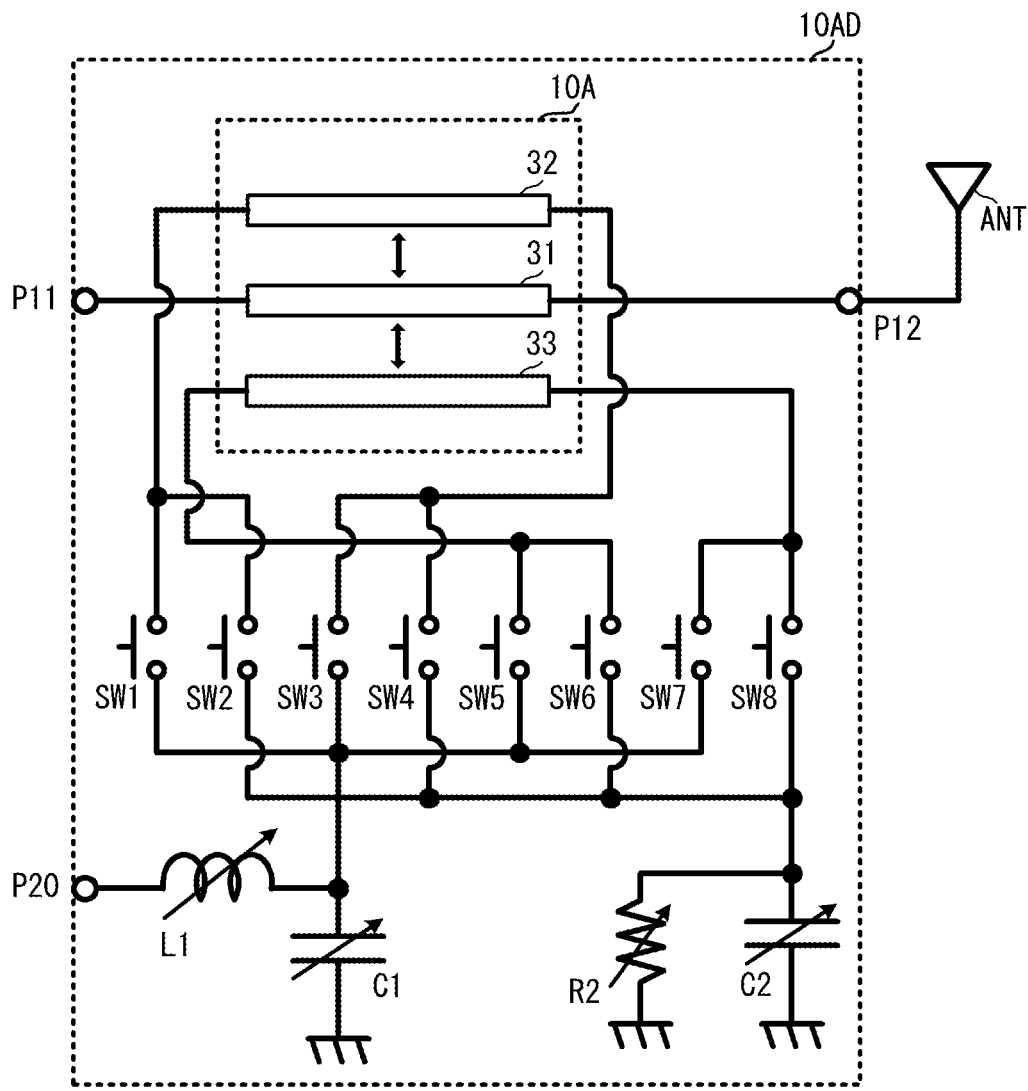
FIG. 9 is an equivalent circuit diagram illustrating an example of the circuit configuration using the directional coupler according to the second embodiment.

FIG. 9 is an equivalent circuit diagram illustrating an example of the circuit configuration using the directional coupler according to the second embodiment. As illustrated in FIG. 9, a directional coupler 10AD includes the directional coupler 10A with the above-mentioned configuration, a plurality of switch elements SW1 to SW8, a variable inductor L1, a variable capacitor C1, a variable capacitor C2, a variable resistor R2, an input/output terminal P11, an input/output terminal P12, and a coupling terminal P20.

The plurality of switch elements SW1 to SW8 form a switch circuit. The variable inductor L1 and the variable capacitor C1 form a coupling-terminal matching circuit. The variable capacitor C2 and the variable resistor R2 form a termination circuit.

The conductor 31 (main line) is connected between the input/output terminal P11 and the input/output terminal P12. The input/output terminal P11 is connected to, for example, an RF signal transmission/reception circuit. The input/output terminal P12 is connected to, for example, an RF signal antenna ANT.

A first end of the conductor 32 (first sub-line) is connected to the switch element SW1 and the switch element SW2. A second end of the conductor 32 is connected to the switch element SW3 and the switch element SW4.

A first end of the conductor 33 (second sub-line) is connected to the switch element SW5 and the switch element SW6. A second end of the conductor 33 is connected to the switch element SW7 and the switch element SW8.

The switch element SW1, the switch element SW3, the switch element SW5, and the switch element SW7 are connected to the coupling terminal P20 with the coupling-terminal matching circuit interposed therebetween. More specifically, the switch element SW1, the switch element SW3, the switch element SW5, and the switch element SW7 are connected to the coupling terminal P20 with the variable inductor L1 interposed therebetween, and the connection point between these switch elements and the variable inductor L1 is grounded (connected to a reference potential) with the variable capacitor C1 interposed therebetween.

The switch element SW2, the switch element SW4, the switch element SW6, and the switch element SW8 are connected to the termination circuit. More specifically, the switch element SW2, the switch element SW4, the switch element SW6, and the switch element SW8 are grounded (connected to a reference potential) with a parallel circuit of the variable capacitor C2 and the variable resistor R2 interposed therebetween.

With the above-described configuration, the switches SW1 to SW8 are appropriately switched, thereby enabling the directional coupler 10AD to output an RF signal in a first frequency band, extracted from the conductor 32, or an RF signal in a second frequency band, extracted from the conductor 33, from the coupling terminal P20. On this occasion, the directional coupler 10AD may output, by switching, a signal transmitted from the input/output terminal P11 to the input/output terminal P12 or a reflection signal of a signal transmitted from the input/output terminal P11 to the input/output terminal P12 as an RF signal in the first frequency band or an RF signal in the second frequency band to the coupling terminal P20.

In the directional coupler 10AD, impedance matching is realized for each RF signal by the coupling-terminal matching circuit including the variable inductor L1 and the variable capacitor C1 and the termination circuit including the variable capacitor C2 and the variable resistor R2. Therefore, the directional coupler 10AD may output signals at a stable level over a certain frequency band from the coupling terminal P20.

Furthermore, since the directional coupler 10AD includes the directional coupler 10A with the above-mentioned configuration, the directional coupler 10AD may realize the stable degree of coupling over a certain frequency band without necessarily being influenced by variations at the time of manufacturing. Like the directional coupler illustrated in FIG. 9, in the case of forming a directional coupler that has a plurality of sub-lines or that switchably uses these sub-lines in a multilayer body, as described above, the sub-lines in different layers can be formed. In this case, because the positions of the sub-lines with respect to the main line may easily deviate due to variations at the time of manufacturing, the degree of coupling may easily change, compared to a directional coupler that only has one sub-line. However, the directional coupler 10AD is configured in such a way that, even in the case where the positions of the sub-lines with respect to the main line deviate, the degree of coupling does not change easily.

In the case of forming a configuration with a plurality of sub-lines as illustrated in FIG. 9 with a multilayer body, a configuration of the related art is such that, depending on the positional relationship of the positions at which a plurality of sub-lines are formed (with respect to the main line), the sub-lines have different amounts of change in their degree of coupling with the main line due to variations at the time of manufacturing. However, using the configuration of the present embodiment, a plurality of sub-lines may be suppressed from having variations in the amount of change in the degree of coupling. Therefore, the level of signals output from the coupling terminal P20 becomes even more stable.

Third Embodiment

Figure 10:
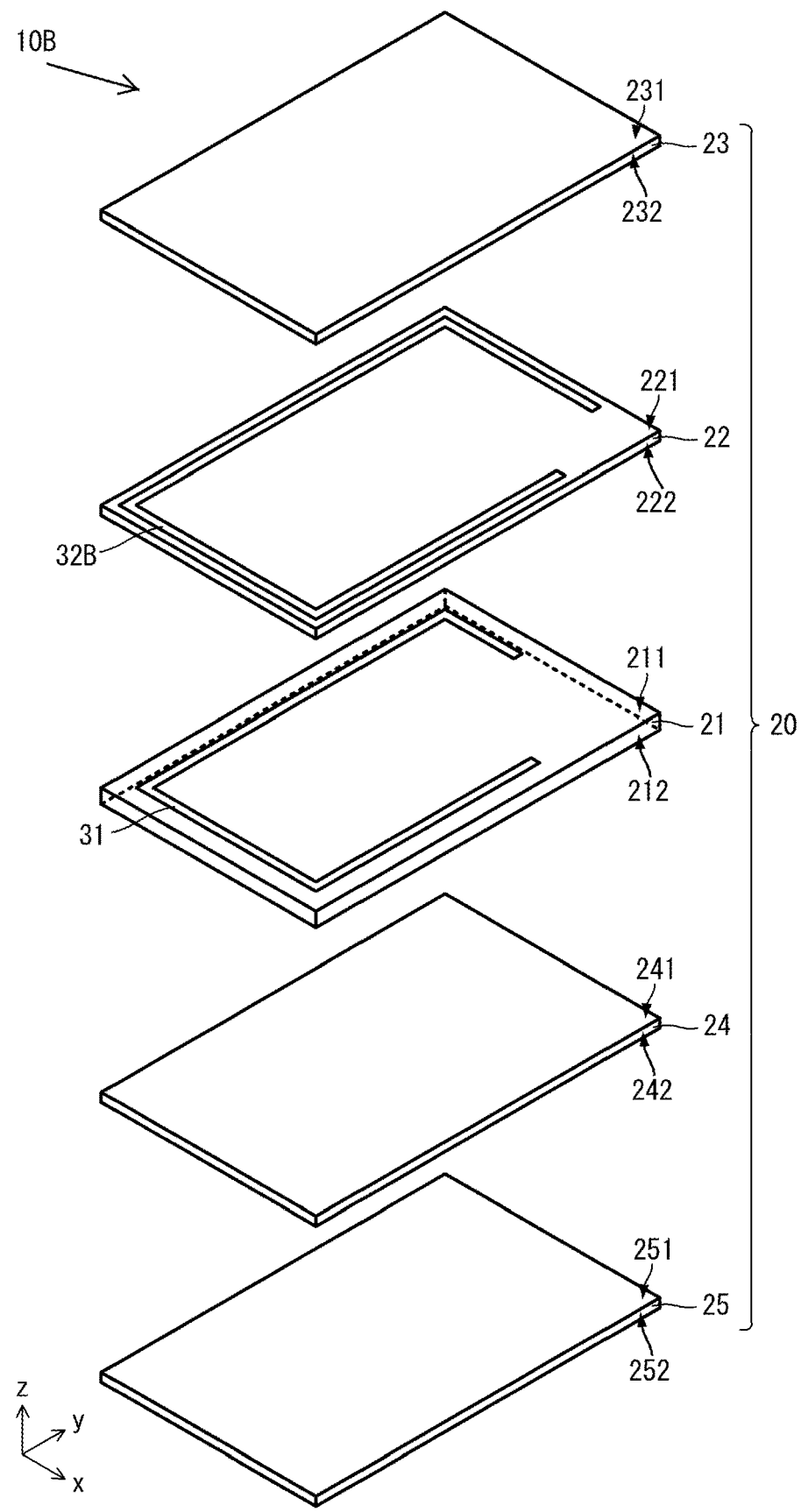
FIG. 10 is an exploded perspective view illustrating the configuration of a directional coupler according to a third embodiment.

A directional coupler according to a third embodiment of the present disclosure will be described with reference to the drawings. FIG. 10 is an exploded perspective view illustrating the configuration of the directional coupler according to the third embodiment. FIGS. 11A and 11B are plan views of certain layers of a multilayer body according to the third embodiment. FIG. 12 is a side sectional view illustrating the configuration of the directional coupler according to the third embodiment. FIG. 12 illustrates a cross section taken along line C-C in FIGS. 11A and 11B.

As illustrated in FIGS. 10, 11A, 11B, and 12, a directional coupler 10B according to the third embodiment is different from the directional coupler 10 according to the first embodiment in the configuration of a conductor 32B. The rest of the configuration of the directional coupler 10B is the same as or similar to the directional coupler 10, and descriptions of the same or similar portions are omitted.

The conductor 32B has a substantially winding shape with approximately one round, and as illustrated in FIG. 11A, has the conductor portion 321, the conductor portion 322, the conductor portion 323, and the conductor portion 324. The conductor portion 321, the conductor portion 322, the conductor portion 323, and the conductor portion 324 are connected in this order.

The conductor portion 321 and the conductor portion 323 are arranged at a distance in the x-direction, and are in a substantially straight line shape extending in the y-direction. The conductor portion 322 and the conductor portion 324 are arranged at a distance in the y-direction, and are in a substantially straight line shape extending in the x-direction. With such a shape, the conductor 32B realizes a substantially winding shape with approximately one round.

The conductor portion 321 is close to and runs parallel to the conductor portion 311 of the conductor 31. The conductor portion 322 is close to and runs parallel to the conductor portion 312 of the conductor 31. The conductor portion 323 is close to and runs parallel to the conductor portion 313 of the conductor 31. The conductor portion 324 is close to and runs parallel to the conductor portion 314 of the conductor 31.

Figure 13A:
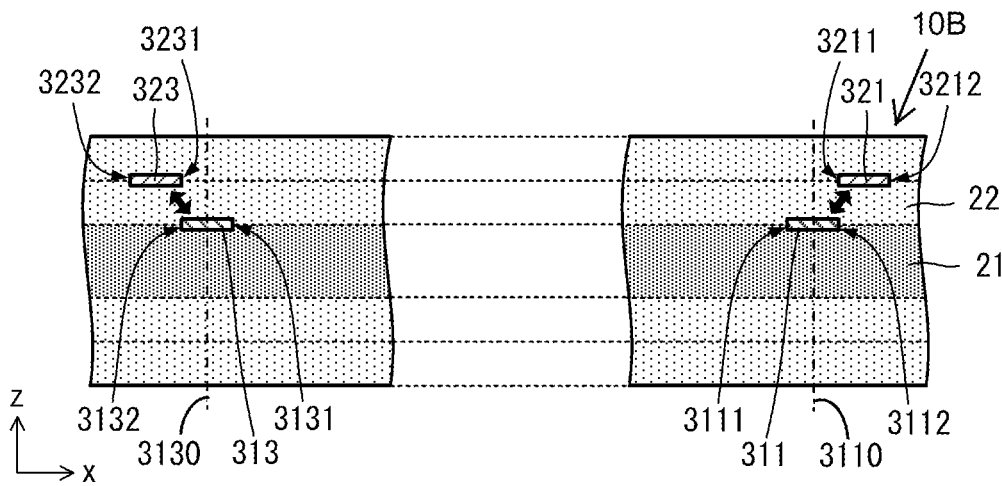
FIGS. 13A, 13B, and 13C are side sectional views illustrating the state of electromagnetic coupling between a main-line conductor and a sub-line conductor in the configuration of the second embodiment.
Figure 13B:
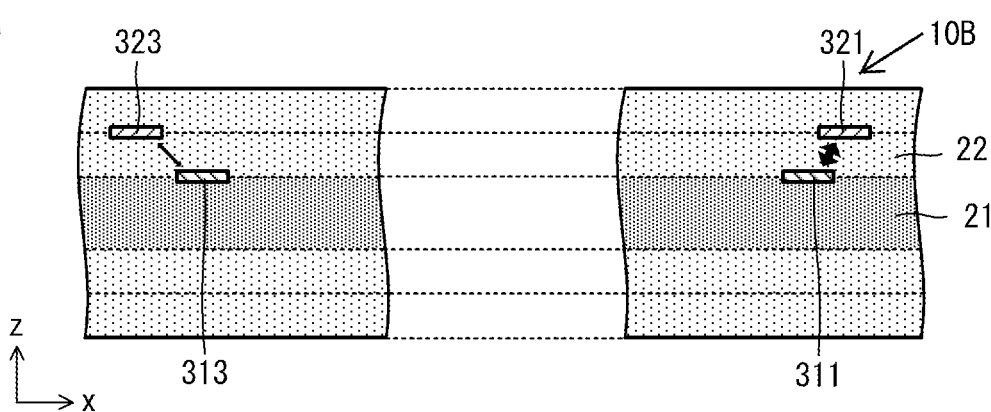
Figure 13C:
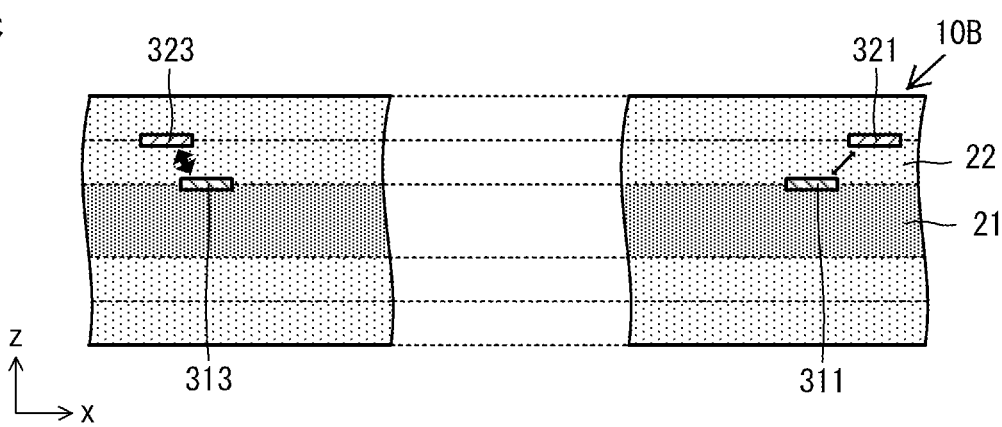

FIGS. 13A, 13B, and 13C are side sectional views illustrating the state of electromagnetic coupling between a main-line conductor and a sub-line conductor in the configuration of the second embodiment. FIGS. 13A, 13B, and 13C each illustrate a cross section taken along line C-C in FIGS. 11A and 11B. FIG. 13A illustrates the case in which the main-line conductor and the sub-line conductor have a positional relationship as designed, and FIGS. 13B and 13C each illustrate the case in which the main-line conductor and the sub-line conductor have a positional relationship deviated from one as designed. The directions of deviation are opposite in FIGS. 13B and 13C.

As illustrated in FIG. 13A, the conductor portion 321 is arranged outside the substantially winding shape formed by the conductor 31, with respect to the conductor portion 311. The conductor portion 323 is arranged outside the substantially winding shape formed by the conductor 31, with respect to the conductor portion 313. That is, the conductor portion 321 and the conductor portion 323 forming the conductor 32B are arranged on the same side with respect to the central axis of the conductor 31 in its extending direction.

Accordingly, as illustrated in FIGS. 13B and 13C, as described in the positional relationship combining the positional relationship between the conductor portion 311 and the conductor portion 321 and the positional relationship between the conductor portion 313 and the conductor portion 323, which is discussed in the first embodiment, even in the case where the conductor 32B deviates in the x-direction with respect to the conductor 31 (even in the case where the positional relationship in the x-direction between the conductor 31 and the conductor 32B changes), a change in electromagnetic coupling between the conductor 31 and the conductor 32B due to the deviation of the conductor 32B may be suppressed.

In addition, the conductor portion 322 is arranged outside the substantially winding shape formed by the conductor 31, with respect to the conductor portion 312. The conductor portion 324 is arranged outside the substantially winding shape formed by the conductor 31, with respect to the conductor portion 314. That is, the conductor portion 322 and the conductor portion 324 forming the conductor 32B are arranged on the same side with respect to the central axis of the conductor 31 in its extending direction. Accordingly, even in the case where the conductor 32B deviates in the y-direction with respect to the conductor 31 (even in the case where the positional relationship in the y-direction between the conductor 31 and the conductor 32B changes), a change in electromagnetic coupling between the conductor 31 and the conductor 32B due to the deviation of the conductor 32B may be suppressed.

In the present embodiment, the mode where the conductor 32B is arranged outside the central axis of the conductor 31 has been discussed. However, the conductor 32B may be arranged inside the central axis of the conductor 31, and even in this configuration, the same or similar operational effects may be achieved.

Fourth Embodiment

Figure 14:
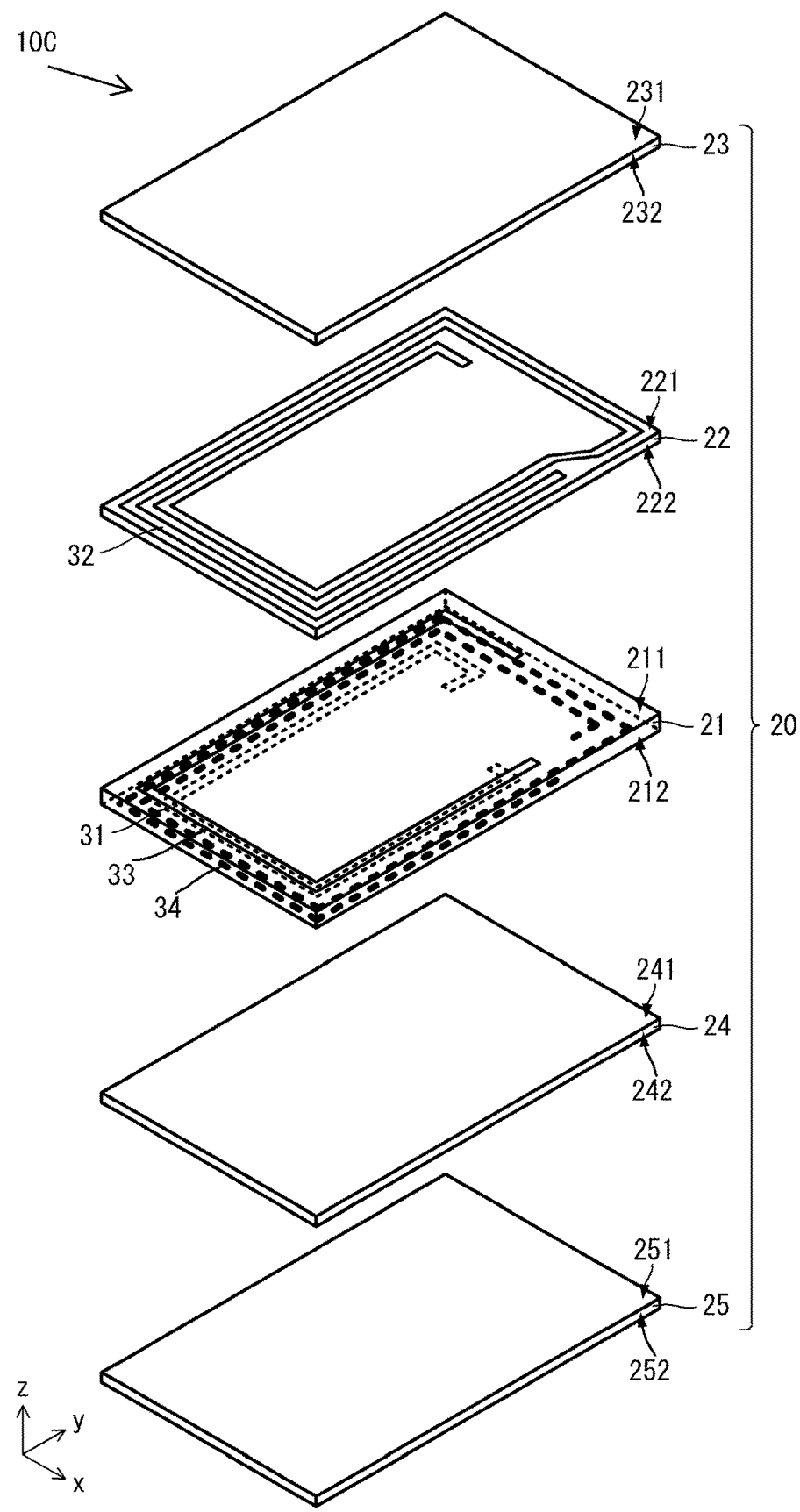
FIG. 14 is an exploded perspective view illustrating the configuration of a directional coupler according to a fourth embodiment.
Figure 15:
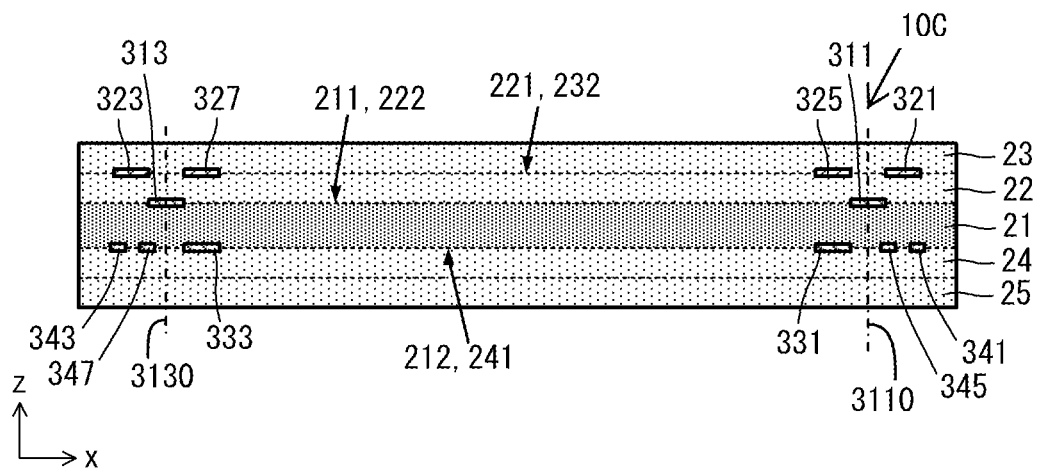
FIG. 15 is a side sectional view illustrating the configuration of the directional coupler according to the fourth embodiment.

A directional coupler according to a fourth embodiment of the present disclosure will be described with reference to the drawings. FIG. 14 is an exploded perspective view illustrating the configuration of the directional coupler according to the fourth embodiment. FIG. 15 is a side sectional view illustrating the configuration of the directional coupler according to the fourth embodiment.

As illustrated in FIGS. 14 and 15, a directional coupler 10C according to the fourth embodiment is different from the directional coupler 10A according to the second embodiment in the point that a conductor 34 is further added, and in the position of the conductor 33. The rest of the configuration of the directional coupler 10C is the same as or similar to the directional coupler 10A, and descriptions of the same or similar portions are omitted.

The conductor 33 is arranged inside the central axis of the conductor 31 in its extending direction.

The conductor 34 is arranged in the same layer as the conductor 33, that is, on the main surface 212 of the insulating layer 21. The conductor 34 is arranged outside the central axis of the conductor 31 in its extending direction. The conductor 34 has a substantially winding shape with approximately two rounds. The conductor 34 has a conductor portion 341, a conductor portion 345, a conductor portion 343, and a conductor portion 347. The conductor portion 341 and the conductor portion 345 run parallel to the conductor 311 of the conductor 31, and the conductor portion 343 and the conductor portion 347 run parallel to the conductor portion 313 of the conductor 31. The distance of the conductor portion 341 and the conductor portion 345 to the conductor 311 is approximately the same as the distance of the conductor portion 343 and the conductor portion 347 to the conductor portion 313.

With the above-described configuration, the directional coupler 10C may realize a configuration where the conductor 31 serves as the main line and the conductor 32, the conductor 33, and the conductor 34 serve as sub-lines. In the directional coupler 10C, a change in electromagnetic coupling between the conductor 31 and the conductor 32 due to a deviation of the conductor 32, a change in electromagnetic coupling between the conductor 31 and the conductor 33 due to a deviation of the conductor 33, and a change in electromagnetic coupling between the conductor 31 and the conductor 34 due to a deviation of the conductor 34 may be suppressed.

Also, in this configuration, even when the insulating layer 21 deforms, a change in electromagnetic coupling between the conductor 31 and the conductor 33 and a change in electromagnetic coupling between the conductor 31 and the conductor 34 may be suppressed. That is, the directional coupler 10C may suppress a change in electromagnetic coupling while tolerating deformation of the insulating layer 21.

In this configuration, the mode where the conductor 32 is arranged above the conductor 31, and the conductor 33 and the conductor 34 are arranged below the conductor 31 in the thickness direction of the multilayer body 20 has been discussed. However, the number of conductors arranged above the conductor 31 and the number of conductors arranged below the conductor 31 are not limited to the above.

Fifth Embodiment

Figure 16A:
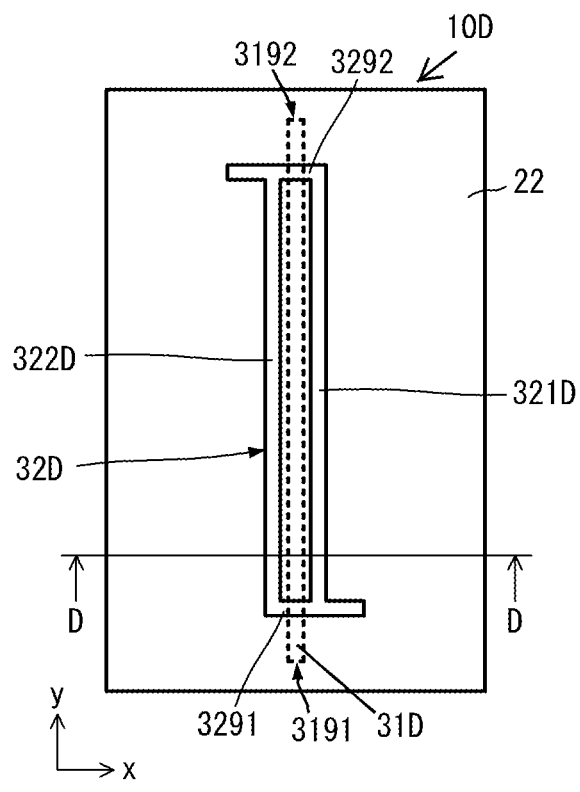
FIGS. 16A and 16B are plan views of certain layers of a multilayer body according to a fifth embodiment.
Figure 16B:
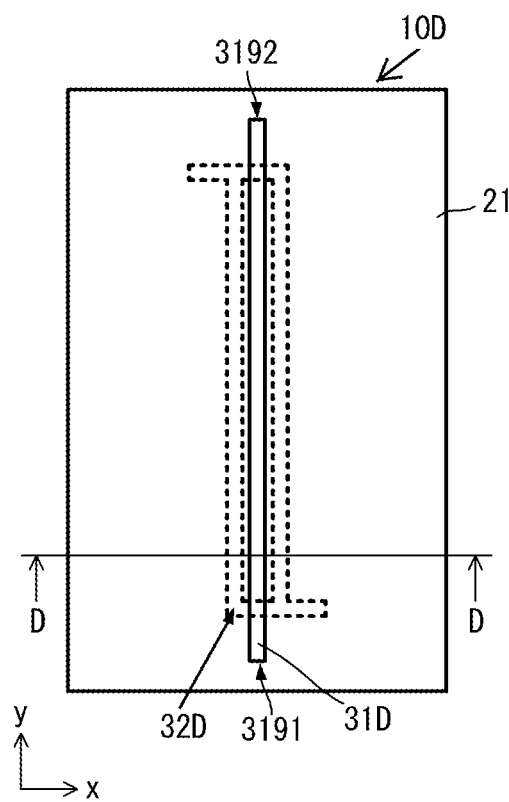
Figure 17A:
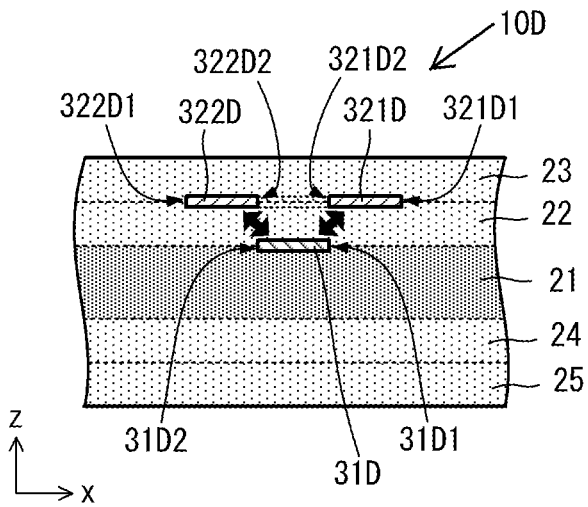
FIGS. 17A, 17B, and 17C are side sectional views illustrating the state of electromagnetic coupling between a main-line conductor and a sub-line conductor in the configuration of the fifth embodiment.
Figure 17B:
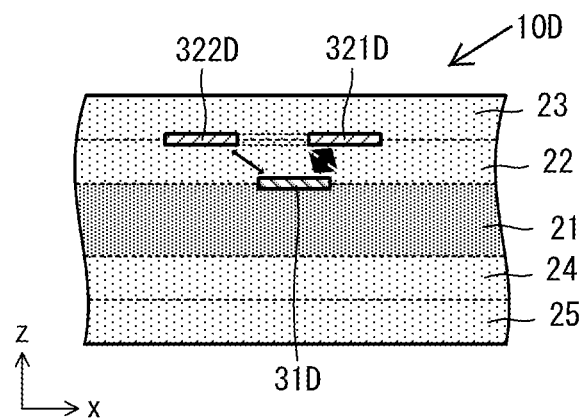
Figure 17C:
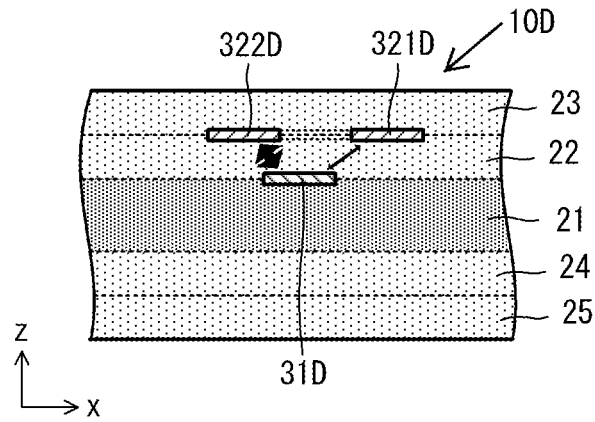

A directional coupler according to a fifth embodiment of the present disclosure will be described with reference to the drawings. FIGS. 16A and 16B are plan views of certain layers of a multilayer body according to the fifth embodiment. FIGS. 17A, 17B, and 17C are side sectional views illustrating the state of electromagnetic coupling between a main-line conductor and a sub-line conductor in the configuration of the fifth embodiment. FIGS. 17A, 17B, and 17C each illustrate a cross section taken along line D-D in FIGS. 16A and 16B. FIG. 17A illustrates the case in which the main-line conductor and the sub-line conductor have a positional relationship as designed, and FIGS. 17B and 17C each illustrate the case in which the main-line conductor and the sub-line conductor have a positional relationship deviated from one as designed. The directions of deviation are opposite in FIGS. 17B and 17C.

As illustrated in FIGS. 16A and 16B, a directional coupler 10D according to the fifth embodiment does not have conductors in a substantially winding shape as described above, and realizes electromagnetic coupling only with conductors in a substantially straight line shape. Note that the basic structure of a multilayer body of the directional coupler 10D is the same as or similar to the multilayer body 20 of the directional coupler discussed in each of the above-described embodiments, and its description is omitted.

The directional coupler 10D includes a conductor 31D and a conductor 32D. The conductor 31D is arranged on the main surface 211 of the insulating layer 21. The conductor 32D is arranged on the main surface 212 of the insulating layer 22. In other words, the conductor 31D and the conductor 32D are arranged at positions with the insulating layer 22 interposed therebetween in the z-direction, which is the thickness direction of the multilayer body.

The conductor 31D is a substantially linear conductor and is in a substantially straight line shape.

The conductor 32D has a conductor portion 321D, a conductor portion 322D, a connection portion 3291, and a connection portion 3292. The length of the conductor portion 321D is the same as the length of the conductor portion 322D. The conductor portion 321D corresponds to a "third portion" of embodiments of the present disclosure, and the conductor portion 322D corresponds to a "fourth portion" of embodiments of the present disclosure. In addition, the connection portion 3291 corresponds to a "first connection portion" of embodiments of the present disclosure, and the connection portion 3292 corresponds to a "second connection portion" of embodiments of the present disclosure.

The conductor portion 321D and the conductor portion 322D are substantially linear conductors and are in a substantially straight line shape. The conductor portion 321D and the conductor portion 322D run parallel to the conductor 31D. On this occasion, when the multilayer body 20 is viewed in plan, the conductor portion 321D and the conductor portion 322D are arranged with the conductor 31D interposed therebetween. In other words, the conductor 31D is arranged between the conductor portion 321D and the conductor portion 322D.

More specifically, the conductor 31D has the following positional relationship with the conductor portion 321D and the conductor portion 322D as illustrated in FIG. 17A.

The conductor 31D has a side end face 31D1 and a side end face 31D2. The side end face 31D1 is a side end face closer to the conductor portion 321D than the side end face 31D2 is, and the side end face 31D2 is a side end face closer to the conductor portion 322D than the side end face 31D1 is.

The conductor portion 321D has a side end face 321D1 and a side end face 321D2. The side end face 321D2 is a side end face facing the conductor portion 322D. The conductor portion 322D has a side end face 322D1 and a side end face 322D2. The side end face 322D2 is a side end face facing the conductor portion 321D.

The above-mentioned conductor 31D being arranged between the conductor portion 321D and the conductor portion 322D is, more specifically, that the side end face 31D1 of the conductor 31D is arranged closer to the conductor portion 322D than the side end face 321D1 of the conductor portion 321D is, and the side end face 31D2 of the conductor 31D is arranged closer to the conductor portion 321D than the side end face 322D2 of the conductor portion 322D is.

The connection portion 3291 connects a first end of the conductor portion 321D in its extending direction and a first end of the conductor portion 322D in its extending direction. The connection portion 3292 connects a second end of the conductor portion 321D in its extending direction and a second end of the conductor portion 322D in its extending direction.

In the above-mentioned configuration, a change in electromagnetic coupling between the conductor 31D and the conductor 32D may be suppressed, as discussed below.

For example, in the case of FIG. 17B, the conductor portion 321D becomes closer to the conductor 31D and the conductor portion 322D becomes farther away from the conductor 31D. In this case, the electromagnetic coupling between the conductor 31D and the conductor portion 321D increases, and the electromagnetic coupling between the conductor 31D and the conductor portion 322D decreases. Accordingly, the coupling obtained by adding the electromagnetic coupling between the conductor 31D and the conductor portion 321D and the electromagnetic coupling between the conductor 31D and the conductor portion 322D, i.e., the electromagnetic coupling between the conductor 31D and the conductor 32D, hardly changes from the electromagnetic coupling between the conductor 31D and the conductor 32D in the case illustrated in FIG. 17A. That is, a change in electromagnetic coupling between the conductor 31D and the conductor 32D due to a deviation of the conductor 32D may be suppressed.

In addition, in the case of FIG. 17C, the conductor portion 321D becomes farther away from the conductor 31D and the conductor portion 322D becomes closer to the conductor 31D. In this case, the electromagnetic coupling between the conductor 31D and the conductor portion 321D decreases, and the electromagnetic coupling between the conductor 31D and the conductor portion 322D increases. Accordingly, the coupling obtained by adding the electromagnetic coupling between the conductor 31D and the conductor portion 321D and the electromagnetic coupling between the conductor 31D and the conductor portion 322D, i.e., the electromagnetic coupling between the conductor 31D and the conductor 32D, hardly changes from the electromagnetic coupling between the conductor 31D and the conductor 32D in the case illustrated in FIG. 17A. That is, a change in electromagnetic coupling between the conductor 31D and the conductor 32D due to a deviation of the conductor 32D may be suppressed.

Also, in this configuration, as illustrated in FIGS. 16A and 16B, the connection portion 3291 is closer to a second end 3192 of the conductor 31D than a first end 3191 is. In addition, the connection portion 3292 is closer to the first end 3191 of the conductor 31D than the second end 3192 is. With the above-described configuration, even in the case where the positional relationship between the conductor 31D and the conductor 32D changes in the y-direction or the x-direction, the distance at which the conductor 31D and the conductor 32D run parallel to each other remains unchanged. Therefore, the directional coupler 10D may suppress a change in the degree of coupling. Note that the first end 3191 and the second end 3192 of the conductor 31D may be arranged between the connection portion 3291 and the connection portion 3292. Accordingly, even in the case where the positional relationship between the conductor 31D and the conductor 32D changes in the y-direction, the directional coupler 10D may suppress a change in the degree of coupling.

Also, in the case where the conductor 31D is used as a sub-line and the conductor 32D is used as a main line in this configuration, the line width of the main line may be made wider. Therefore, the directional coupler 10D may reduce a loss of RF signals flowing through the main line.

Sixth Embodiment

Figure 18:
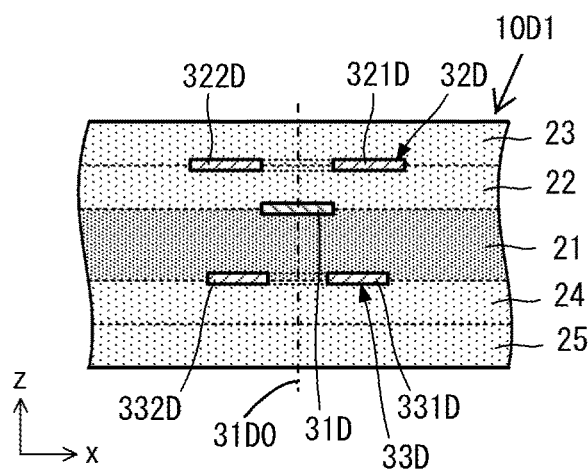
FIG. 18 is a side sectional view of part of a directional coupler according to a sixth embodiment.

A directional coupler according to a sixth embodiment of the present disclosure will be described with reference to the drawings. FIG. 18 is a side sectional view of part of the directional coupler according to the sixth embodiment.

As illustrated in FIG. 18, a directional coupler 10D1 according to the sixth embodiment is different from the directional coupler 10D according to the fifth embodiment in the point that a conductor 33D is added. The rest of the configuration of the directional coupler 10D1 is the same as or similar to the directional coupler 10D, and descriptions of the same or similar portions are omitted.

The directional coupler 10D1 includes the conductor 33D. The conductor 33D has a conductor portion 331D and a conductor portion 332D. Both ends of the conductor portion 331D and the conductor portion 332D in their extending direction are connected by connection portions (not illustrated).

The conductor portion 331D and the conductor portion 332D are arranged on the main surface 212 of the insulating layer 21 (abutment face between the insulating layer 21 and the insulating layer 24).

The conductor portion 331D and the conductor portion 332D run parallel to the conductor 31D. The conductor portion 331D is arranged on the same side as the conductor portion 321D, with respect to a central axis 31D0 of the conductor 31D. The conductor portion 332D is arranged on the same side as the conductor portion 322D, with respect to the central axis 31D0 of the conductor 31D. That is, the conductor portion 331D and the conductor portion 332D are arranged at positions with the central axis 31D0 of the conductor 31D interposed therebetween.

With the above-described configuration, the directional coupler 10D1 may realize a configuration allowing two sub-lines to couple to one main line. The directional coupler 10D1 may suppress a change in the degree of coupling of each of the sub-lines even when the positions of the conductor 32D and the conductor 33D with respect to the conductor 31D change.

On this occasion, as described in the above-described embodiments, since the position of the conductor 33D with respect to the conductor 31D hardly changes, the conductor 33D can be assigned to RF signals susceptible to a change in the degree of coupling.

First Derivative Example

Figure 19:
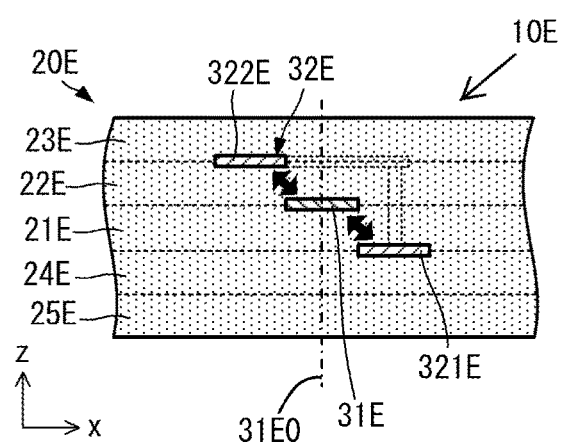
FIG. 19 is a side sectional view of part of a derivative configuration of the directional coupler according to the sixth embodiment.

Although the case in which conductor portions forming one sub-line are arranged in the same layer has been discussed in each of the above-described embodiments, the sub-lines may be arranged in different layers, as illustrated in FIG. 19. FIG. 19 is a side sectional view of part of a derivative configuration of the directional coupler according to the sixth embodiment.

As illustrated in FIG. 19, a directional coupler 10E includes a multilayer body 20E. The multilayer body 20E includes insulating layers 21E to 25E, which are made of the same material and which have the same thickness.

A conductor 31E is arranged on the abutment face (boundary) between the insulating layer 21E and the insulating layer 22E.

A conductor 32E has a conductor portion 321E and a conductor portion 322E. The conductor portion 321E is arranged on the abutment face (boundary) between the insulating layer 21E and the insulating layer 24E. The conductor portion 322E is arranged on the abutment face (boundary) between the insulating layer 22E and the insulating layer 23E. The conductor portion 321E and the conductor portion 322E run parallel to the conductor 31E and have the same degree of coupling with the conductor 31E. The conductor portion 321E and the conductor portion 322E are arranged at positions with a central axis 31E0 of the conductor 31E interposed therebetween.

With the above-described configuration, the directional coupler 10E may suppress a change in the degree of coupling between the conductor 31E and the conductor 32E even when the positional relationship between the conductor 31E and the conductor 32E changes.

Note that both ends of the conductor portion 321E and the conductor portion 322E may be connected in parallel by, for example, connection portions and inter-layer connection conductors.

Second Derivative Example

The case in which one conductor portion or two conductor portions are electromagnetically coupled to one conductor portion has been discussed in each of the above-described embodiments. However, the above-mentioned configuration is also applicable to the mode where a plurality of conductor portions are coupled to a plurality of conductor portions, as illustrated in FIG. 20.

Figure 20:
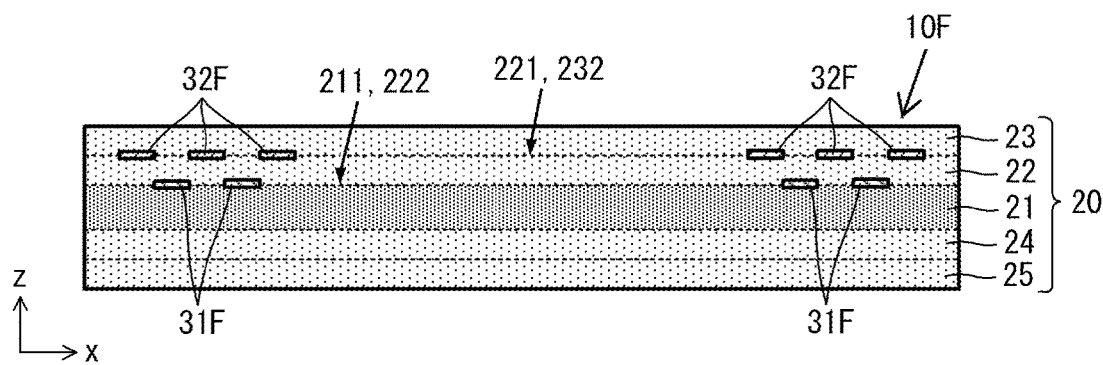
FIG. 20 is a side sectional view of part of a derivative configuration of the directional coupler according to the first embodiment.

FIG. 20 is a side sectional view of part of a derivative configuration of the directional coupler according to the first embodiment. As illustrated in FIG. 20, in a directional coupler 10F, a conductor 31F and a conductor 32F each have a substantially winding shape with a plurality of rounds. The number of rounds of the conductor 32F is greater than the number of rounds of the conductor 31F by one. Even with such a configuration, by realizing the configuration of each portion of the conductor 31F and each portion of the conductor 32F running parallel thereto with the above-mentioned concept, the directional coupler 10F may suppress a change in the degree of coupling due to a change in the positional relationship between the conductor 31F and the conductor 32F.

Note that the configurations of the above-described embodiments and the configurations of the derivative examples may be combined appropriately, and operational effects according to each of the combinations may be achieved.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A directional coupler comprising:
    a multilayer body comprising a first insulating layer with a first main surface and a second insulating layer arranged facing the first main surface;
    a first conductor that is arranged in the first insulating layer and that has a first shape; and
    a second conductor that is arranged on a side of the second insulating layer opposite the first insulating layer, that runs parallel to the first conductor, and that is electromagnetically coupled to the first conductor,
    wherein the second conductor has:
        a winding shape with one or more rounds, and
        a first portion and a second portion that extend parallel to each other in a parallel running direction, and that are arranged adjacent to each other in a direction orthogonal to the parallel running direction,
    wherein in a plan view of the multilayer body, the first conductor is arranged between the first portion and the second portion, and
    wherein the first portion comprises two parallel members and the second portion comprises two parallel members, the parallel members of the second portion being between the parallel members of the first portion.

2. The directional coupler according to claim 1, wherein:
    the first conductor forms a main line, and
    the second conductor forms a first sub-line.

3. The directional coupler according to claim 2, further comprising:
    a third conductor that is formed in the multilayer body, that runs parallel to and is electromagnetically coupled to the first conductor, and that forms a second sub-line.

4. The directional coupler according to claim 3, further comprising:
    a termination circuit connected to a first end portion of the second conductor or a first end portion of the third conductor;
    a coupling terminal connected to a second end portion of the second conductor or a second end portion of the third conductor; and
    a switch circuit configured to selectively connect one of the second conductor or the third conductor to the termination circuit and the other of the second conductor or the third conductor to the coupling terminal.

5. The directional coupler according to claim 3, wherein the third conductor is arranged opposite to the first conductor with the first insulating layer interposed between the first conductor and the third conductor.

6. The directional coupler according to claim 5, wherein the third conductor is shorter than the second conductor.

7. The directional coupler according to claim 3,
    wherein the third conductor has a seventh portion and an eighth portion that are arranged with a space therebetween in the direction orthogonal to the parallel running direction, and
    wherein in the plan view of the multilayer body, the first conductor is arranged between the seventh portion and the eighth portion.

8. The directional coupler according to claim 1, wherein:
    the first conductor forms a sub-line, and
    the second conductor forms a main line.

9. The directional coupler according to claim 1, wherein:
    the first insulating layer is a core material layer, and
    the second insulating layer is a prepreg layer.

10. A directional coupler comprising:
    a multilayer body comprising a first insulating layer with a first main surface and a second insulating layer arranged facing the first main surface;
    a linear first conductor arranged in the first insulating layer; and
    a second conductor that is arranged on a side of the second insulating layer opposite the first insulating layer, that runs parallel to the first conductor in a plan view of the multilayer body, and that is electromagnetically coupled to the first conductor,
    wherein the second conductor has:
        a third portion and a fourth portion that extend parallel to each other in a parallel running direction, and that are arranged with a space therebetween in a direction orthogonal to the parallel running direction,
        a first connection portion that connects a first end portion of the third portion to a first end portion of the fourth portion, and
        a second connection portion that connects a second end portion of the third portion to a second end portion of the fourth portion, and
    wherein in the plan view of the multilayer body, the first conductor is arranged between the third portion and the fourth portion.

11. The directional coupler according to claim 10, wherein:
    the first conductor forms a main line, and
    the second conductor forms a first sub-line.

12. The directional coupler according to claim 11, further comprising:
    a third conductor that is formed in the multilayer body, that runs parallel to and is electromagnetically coupled to the first conductor, and that forms a second sub-line.

13. The directional coupler according to claim 12, further comprising:
    a termination circuit connected to a first end portion of the second conductor or a first end portion of the third conductor;
    a coupling terminal connected to a second end portion of the second conductor or a second end portion of the third conductor; and
    a switch circuit configured to selectively connect one of the second conductor or the third conductor to the termination circuit and the other of the second conductor or the third conductor to the coupling terminal.

14. The directional coupler according to claim 12,
    wherein the third conductor has a seventh portion and an eighth portion that are arranged with a space therebetween in the direction orthogonal to the parallel running direction, and wherein in the plan view of the multilayer body, the first conductor is arranged between the seventh portion and the eighth portion.

15. The directional coupler according to claim 12, wherein the third conductor is arranged opposite to the first conductor with the first insulating layer interposed between the first conductor and the third conductor.

16. The directional coupler according to claim 15, wherein the third conductor is shorter than the second conductor.

17. The directional coupler according to claim 10, wherein:
in the plan view of the multilayer body, both of the first connection portion and the second connection portion overlap the first conductor, or
in the plan view of the multilayer body, both of the first connection portion and the second connection portion do not overlap the first conductor.

18. The directional coupler according to claim 10, wherein the second conductor has a fifth portion and a sixth portion that extend in a same direction and that are arranged to have, between the fifth portion and the sixth portion, a central aperture of the winding shape, and
wherein when the multilayer body is viewed in the plan view, a position of the fifth portion with respect to a central axis of the first conductor in the extending direction thereof in a portion where the fifth portion and the first conductor run parallel to each other is the same as a position of the sixth portion with respect to a central axis of the first conductor in the extending direction thereof in a portion where the sixth portion and the first conductor run parallel to each other.

19. The directional coupler according to claim 10, wherein:
the first conductor forms a sub-line, and
the second conductor forms a main line.

20. A directional coupler comprising:
a multilayer body comprising a first insulating layer with a first main surface and a second insulating layer arranged facing the first main surface;
a linear first conductor arranged in the first insulating layer; and
a second conductor that is arranged on a side of the second insulating layer opposite the first insulating layer, that runs parallel to the first conductor, and that is electromagnetically coupled to the first conductor,
wherein the first conductor and the second conductor each have a winding shape,
wherein the second conductor has a fifth portion and a sixth portion that extend in a same direction and that are arranged to have, between the fifth portion and the sixth portion, a central aperture of the winding shape,
wherein when the multilayer body is viewed in a plan view, a position of the fifth portion with respect to a central axis of the first conductor in the extending direction thereof in a portion where the fifth portion and the first conductor run parallel to each other is the same as a position of the sixth portion with respect to a central axis of the first conductor in the extending direction thereof in a portion where the sixth portion and the first conductor run parallel to each other, and
wherein the fifth portion comprises two parallel members and the sixth portion comprises two parallel members, the parallel members of the sixth portion being between the parallel members of the fifth portion.

* * * * *